(12) United States Patent
Su et al.

(10) Patent No.: US 11,735,263 B2
(45) Date of Patent: Aug. 22, 2023

(54) MEMORY CELL ARRAY CIRCUIT AND METHOD OF FORMING THE SAME

(71) Applicant: TAIWAN SEMICONDUCTOR MANUFACTURING COMPANY, LTD., Hsinchu (TW)

(72) Inventors: Chin-I Su, Hsinchu (TW); Chung-Cheng Chou, Hsinchu (TW); Yu-Der Chih, Hsinchu (TW); Zheng-Jun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/871,144

(22) Filed: Jul. 22, 2022

(65) Prior Publication Data
US 2022/0359010 A1  Nov. 10, 2022

Related U.S. Application Data

(62) Division of application No. 17/103,239, filed on Nov. 24, 2020.
(Continued)

(51) Int. Cl.
*G11C 13/00* (2006.01)

(52) U.S. Cl.
CPC ...... *G11C 13/0069* (2013.01); *G11C 13/0028* (2013.01); *G11C 13/0038* (2013.01); *G11C 2013/0078* (2013.01); *G11C 2213/79* (2013.01)

(58) Field of Classification Search
CPC ............ G11C 13/0069; G11C 13/0028; G11C 13/0038; G11C 2013/0078;
(Continued)

(56) References Cited

U.S. PATENT DOCUMENTS

| 5,058,491 A | 10/1991 | Wiemer et al. |
| 7,372,764 B2 | 5/2008 | Nautiyal et al. |

(Continued)

FOREIGN PATENT DOCUMENTS

| KR | 20160005549 | 1/2016 |
| KR | 20190140721 | 12/2019 |

(Continued)

OTHER PUBLICATIONS

Keeth, Brent et al., "DRAM Circuit Design Fundamental and High-Speed Topics", vol. 13, John Wiley & Sons, 2007, S. 147, 148, 166, 167.
(Continued)

*Primary Examiner* — Khamdan N. Alrobaie
(74) *Attorney, Agent, or Firm* — Hauptman Ham, LLP

(57) ABSTRACT

A method of operating a memory circuit includes generating a first voltage by a first amplifier circuit of a first driver circuit coupled to a first column of memory cells, and generating a first current in response to the first voltage. The first current includes a first set of leakage currents and a first write current. The method further includes generating, by a tracking circuit, a second set of leakage currents configured to track the first set of leakage currents of the first column of memory cells, and mirroring the first current in a first path with a second current in a second path by a first current mirror. The second current includes the second set of leakage currents and a second write current. The first write current corresponds to the second write current. The first set of leakage currents corresponds to the second set of leakage currents.

20 Claims, 17 Drawing Sheets

Related U.S. Application Data

(60) Provisional application No. 63/045,961, filed on Jun. 30, 2020.

(58) Field of Classification Search
 CPC ........ G11C 2213/79; G11C 2029/5006; G11C 5/147; G11C 7/04; G11C 7/14; G11C 13/0033; G11C 13/003; G11C 8/12; G11C 7/06; G11C 11/40
 See application file for complete search history.

(56) References Cited

U.S. PATENT DOCUMENTS

| | | | |
|---|---|---|---|
| 7,446,549 | B2 | 11/2008 | Tomita et al. |
| 2006/0050590 | A1* | 3/2006 | Nautiyal ............... G11C 11/413 365/226 |
| 2010/0214863 | A1 | 8/2010 | Chan et al. |
| 2012/0163106 | A1 | 6/2012 | Shim |
| 2013/0148402 | A1 | 6/2013 | Chang et al. |
| 2013/0286761 | A1 | 10/2013 | Wang et al. |
| 2015/0371702 | A1 | 12/2015 | Wu et al. |
| 2016/0148660 | A1 | 5/2016 | Katoch |
| 2019/0006020 | A1* | 1/2019 | Sundaresan ...... G11C 29/12005 |
| 2019/0051351 | A1* | 2/2019 | Pyo ..................... G11C 11/1657 |
| 2019/0198098 | A1 | 6/2019 | Yang et al. |
| 2019/0371398 | A1* | 12/2019 | Chou ................. G11C 13/0028 |
| 2020/0105345 | A1 | 4/2020 | Baek et al. |

FOREIGN PATENT DOCUMENTS

| | | |
|---|---|---|
| KR | 20200038346 | 4/2020 |
| TW | I453749 | 9/2014 |
| TW | I456739 | 10/2014 |

OTHER PUBLICATIONS

Notice of Allowance dated Jun. 29, 2022 for corresponding case No. KR 10-2021-0009324. (pp. 1-6) English translation attached on p. 1.

Office Action dated Feb. 16, 2022 from corresponding appl. No. KR 10-2021-0009324 (pp. 1-5).

Office Action dated Nov. 26, 2021 from corresponding appl. No. TW 11021160560 (pp. 1-4).

* cited by examiner

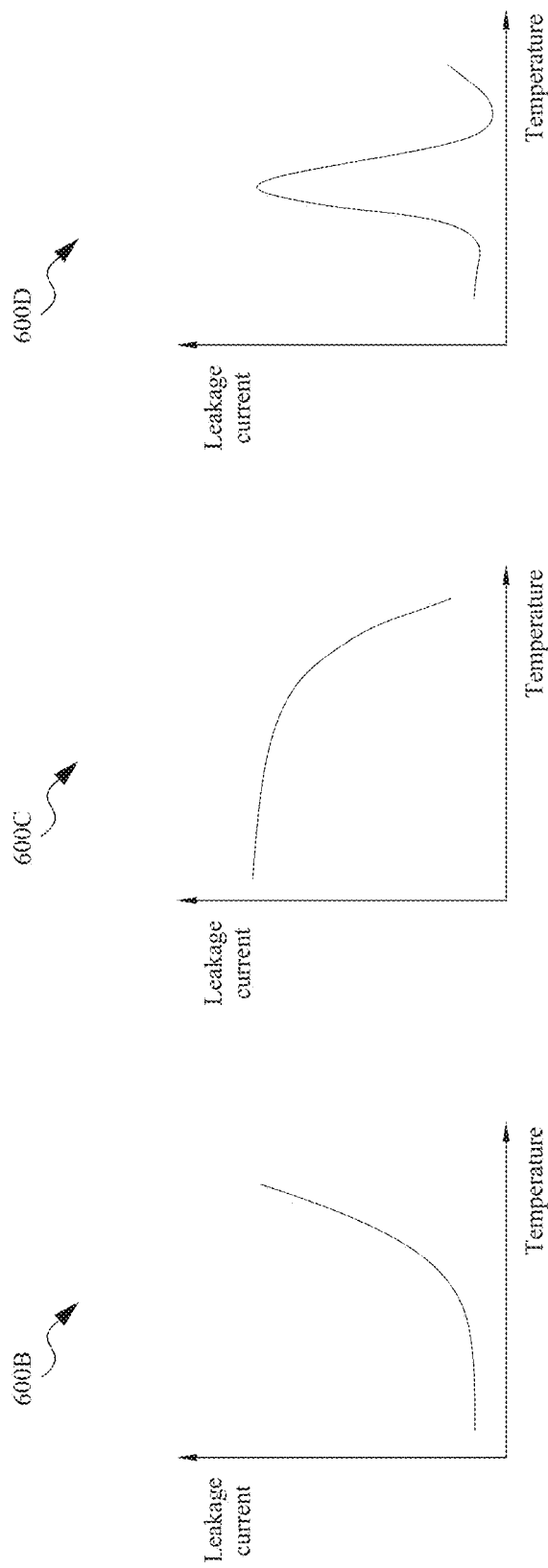

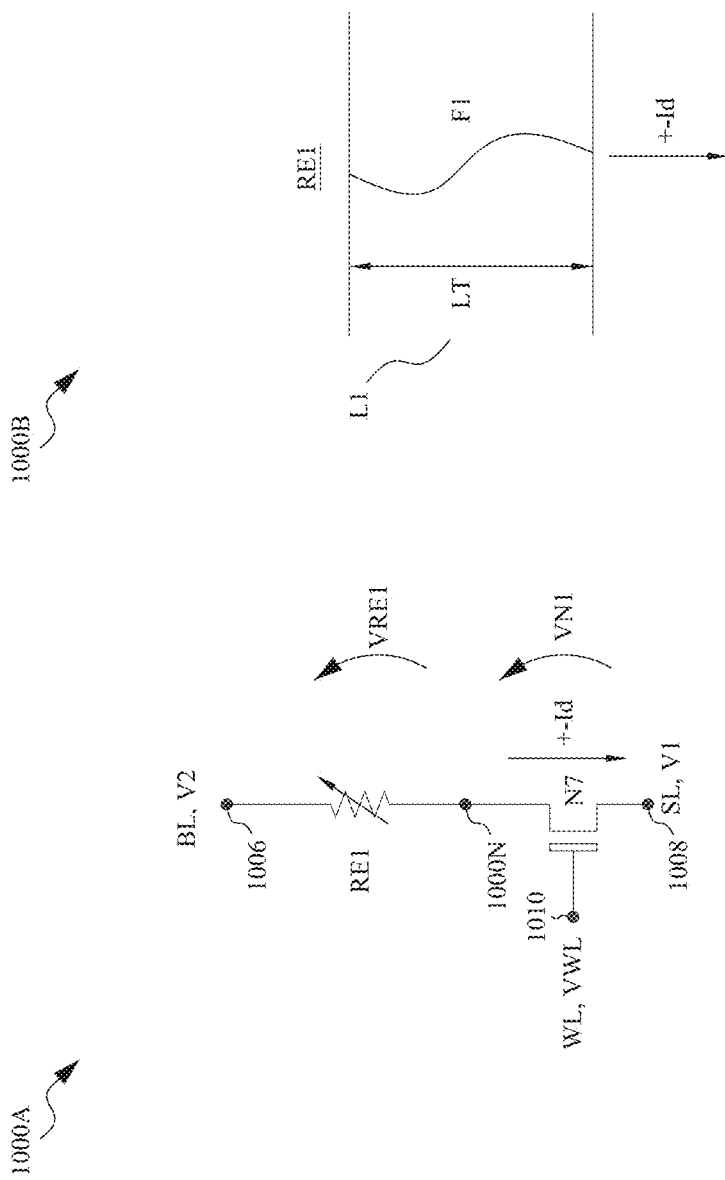

MEMORY CELL ARRAY CIRCUIT AND METHOD OF FORMING THE SAME

PRIORITY CLAIM

The present application is a divisional of U.S. application Ser. No. 17/103,239, filed Nov. 24, 2020, now U.S. Pat. No. 11,636,896, issued Apr. 25, 2023, which claims the benefit of U.S. Provisional Application No. 63/045,961, filed Jun. 30, 2020, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6B, 6C and 6D are corresponding waveforms generated by a memory circuit, in accordance with some embodiments.

FIG. 10A is a diagram of RRAM device, in accordance with some embodiments.

FIG. 10B is a diagram of variable resistance structure, in accordance with some embodiments.

DETAILED DESCRIPTION

Figure 1:
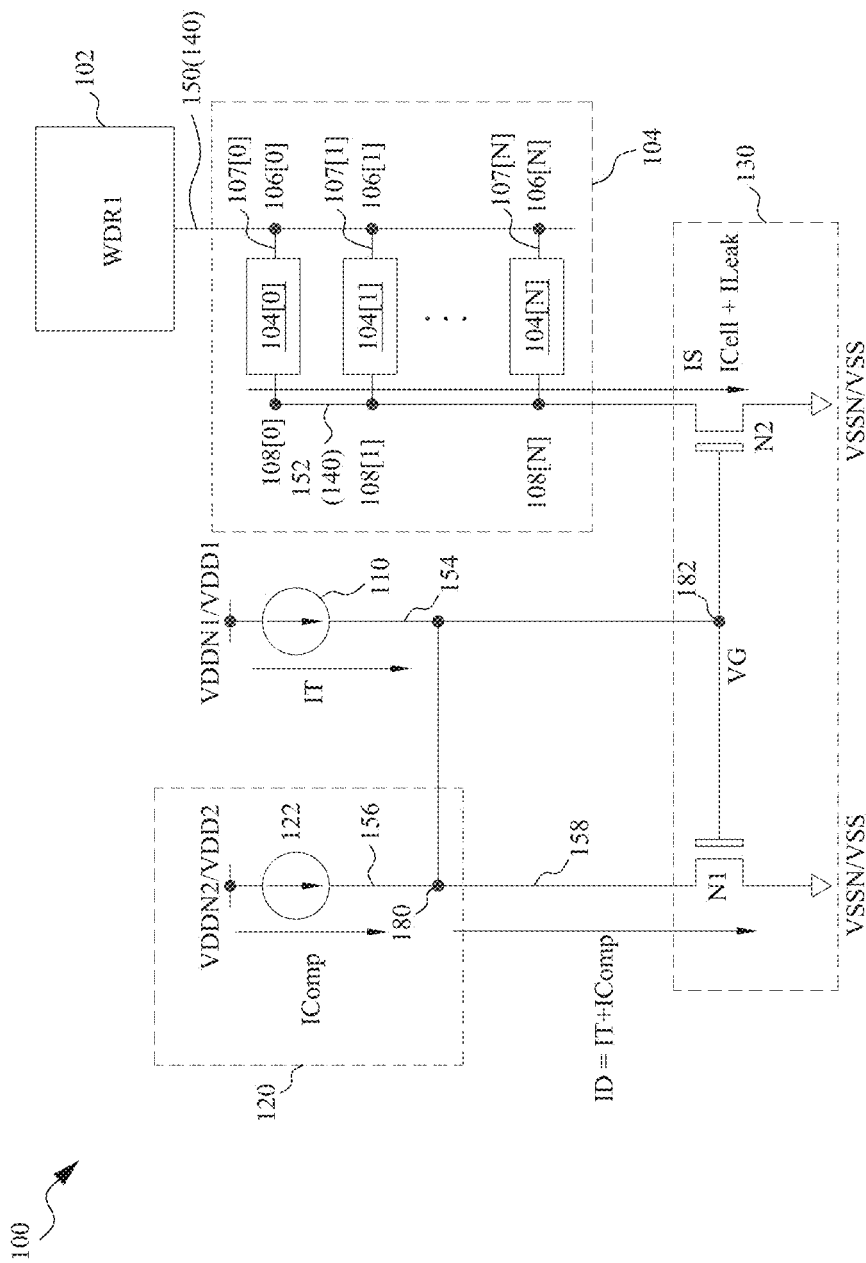
FIG. 1 is a circuit diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first driver circuit, a first column of memory cells coupled to the first driver circuit, a first current source, a tracking circuit configured to track a leakage current of the first column of memory cells, and a footer circuit coupled to the first column of memory cells, the first current source and the tracking circuit.

In some embodiments, the tracking circuit includes a second driver circuit, and a first column of tracking cells coupled between a first conductive line and a second conductive line. In some embodiments, the first conductive line is coupled to the second driver circuit.

In some embodiments, the first column of tracking cells is configured to track the leakage current of the first column of memory cells during a write or programming operation of a memory cell in the first column of memory cells. In some embodiments, by tracking the leakage current of the first column of memory cells during the programming operation, results in a memory circuit having better write performance compared with other approaches.

In some embodiments, during a write operation of the memory cell in the first column of memory cells, as a temperature of the memory circuit increases, the leakage current in the first column of memory cells also increases. In some embodiments, by tracking the leakage current of the first column of memory cells during the programming operation, results in a memory circuit able to account for increases in leakage current attributable to increases in temperature yielding a memory circuit with better write performance across a range of temperatures compared with other approaches.

Memory Circuit

FIG. 1 is a circuit diagram of a memory circuit 100, in accordance with some embodiments.

Memory circuit 100 includes a driver circuit 102, a memory cell array 104, a current source 110, a tracking circuit 120 and a footer circuit 130.

Driver circuit 102 is coupled to memory cell array 104 by a conductive path 150 and a conductive path 107. In some embodiments, the term "path" as used in the remaining portions of this disclosure corresponds to the term "conductive path," and is shortened for brevity.

Figure 3A:
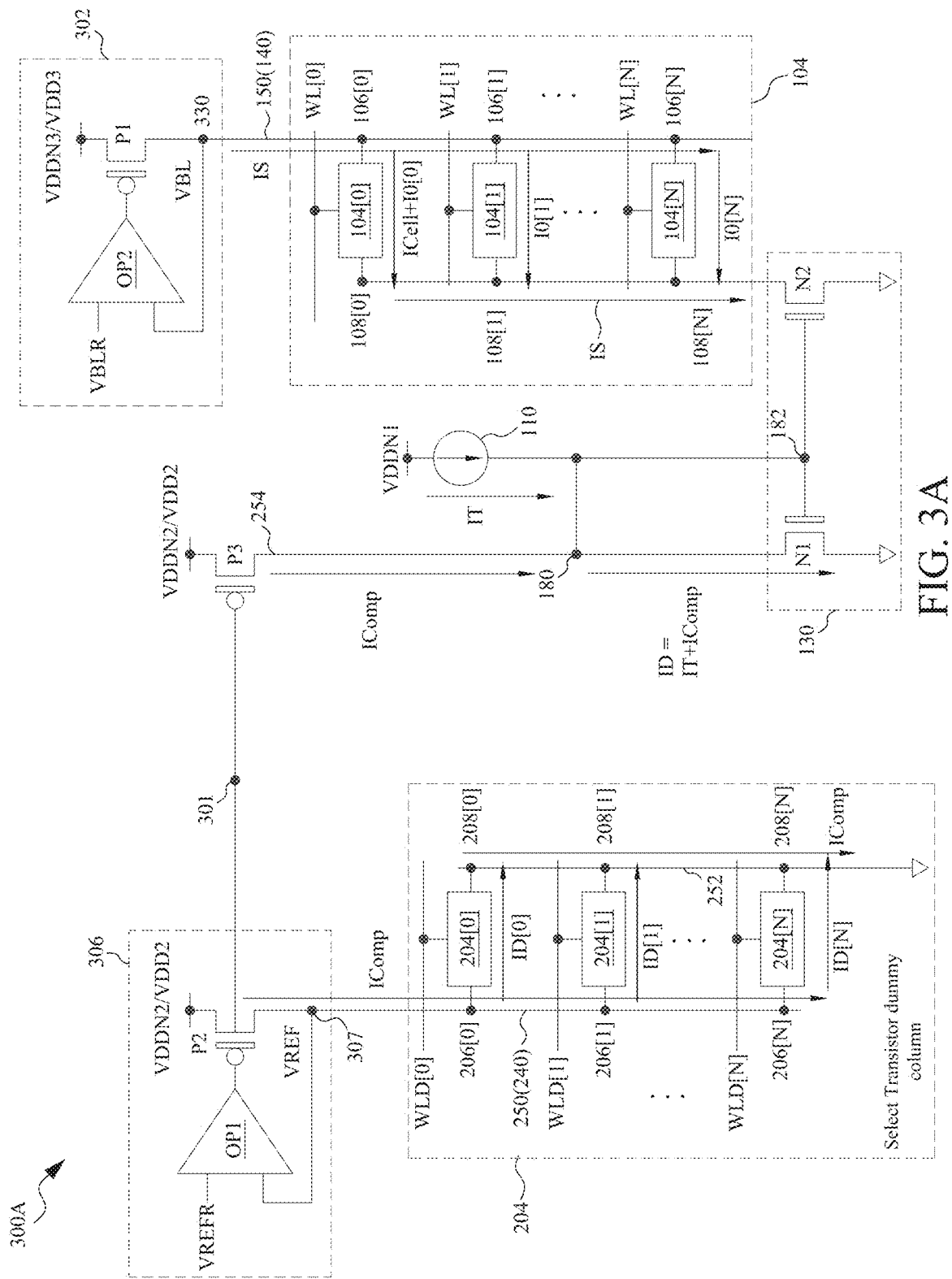
FIG. 3A is a circuit diagram of a memory circuit, in accordance with some embodiments.

Driver circuit 102 is configured to generate a voltage VBL (shown in FIG. 3A). Driver circuit 102 is configured to write data into one or more memory cells in memory cell array 104. In some embodiments, driver circuit 102 is referred to as a write driver circuit. In some embodiments, at least path 150 or path 107 corresponds to a bit line BL.

Memory cell array 104 comprises an array of memory cells 104[0], 104[1], ..., 104[N] having N rows, where N is a positive integer. Memory cell array 104 is shown with a single column for brevity and ease of illustration. In some embodiments, memory cell array 104 further includes M columns, where M is a positive integer corresponding to the number of columns in memory cell array 104. In some embodiments, each memory cell in memory cell array 104 is configured to store a corresponding bit of data.

The rows of cells in memory cell array 104 are arranged in a first direction X. The columns of cells in memory cell array 104 are arranged in a second direction Y. The second direction Y is different from the first direction X. In some embodiments, the second direction Y is perpendicular to the first direction X. Memory cell 1000A-1000B of FIGS. 10A-10B is usable as one or more memory cells in memory cell array 104.

Each memory cell 104[0], 104[1], ..., 104[N] in memory cell array 104 is coupled between path 150 and 152 by a corresponding path 107[0], 107[1], ..., 107[N] (collectively referred to as "path 107"). A first end of each memory cell 104[0], 104[1], ..., 104[N] in memory cell array 104 is coupled to path 150 by a corresponding node 106[0], 106[1], ..., 106[N] (collectively referred to as "node 106"). A second end of each memory cell 104[0], 104[1], ..., 104[N] in memory cell array 104 is coupled to path 152 by a corresponding node 108[0], 108[1], ..., 108[N] (collectively referred to as "node 108").

Memory cell array 104 further includes N+1 word lines WL[0], ... WL[N] (shown in FIGS. 3A-3B for ease of illustration; collectively referred to as "word line WL") coupled to a corresponding row of memory cells in memory cell array 104. Each row 1, ..., N in memory cell array 104 is associated with a corresponding word line WL[1], ..., WL[N]. Each word line WL extends in the first direction X.

In some embodiments, each memory cell 104[0], 104[1], ..., 104[N] in memory cell array 104 corresponds to a resistive random-access memory (RRAM) cell. In some embodiments, each memory cell 104[0], 104[1], ..., 104[N] in memory cell array 104 includes a corresponding resistive switching element RE1 coupled to a corresponding selector element SE1 (FIGS. 10A-10B).

Different types of memory cells in memory cell array 104 are within the contemplated scope of the present disclosure. For example, in some embodiments, memory cell array 104 is a non-volatile random-access memory (NVRAM) array. In some embodiments, at least memory cell 104[0], 104[1], ..., 104[N] in memory cell array 104 corresponds to a magneto-resistive random-access memory (MRAM) cell. Different configurations of memory cell array 104 are within the contemplated scope of the present disclosure.

A current path 140 is coupled between driver circuit 102 and power reference node VSSN. Current path 140 includes path 150, paths 107 and path 152. In some embodiments, current path 140 has a corresponding current IS.

Current source 110 is coupled to tracking circuit 120 by a node 180. Current source 110 is coupled to footer circuit 130 by a node 182. Current source 110 is coupled to node 180 by a path 154. Current source 110 is an electronic circuit configured to receive power supply voltage VDD1 from power supply node VDDN1, and generate current IT having one or more predetermined current levels. Current IT is configured to flow from current source 110 to node 180 by path 154. In some embodiments, at least one predetermined current level is based on a compliance level of an RRAM device, e.g., a memory cell of memory cell array 104, in a write operation, the compliance level being a maximum current level designed to avoid an undesirable condition, e.g., an overheating and/or damaging stress level, or performance of an unreliable programming operation. In various embodiments, current source 110 is configured to generate current IT having a predetermined current level equal to a compliance level or to another level derived from the compliance level, e.g., a multiple or fraction of the compliance level.

Tracking circuit 120 is coupled to footer circuit 130 and current source 110 by node 180. Tracking circuit 120 is configured to generate a current IComp. In some embodiments, the tracking circuit 120 is configured to track a leakage current ILeak (e.g., I0[0], I0[1], ..., I0[N] shown in FIG. 3A) generated by memory cell array 104. In some embodiments, the tracking current IComp is configured to track the leakage current ILeak generated by memory cell array 104. In some embodiments, the tracking current IComp is equal to the leakage current ILeak. In some embodiments, the tracking current IComp is equal to a proportion (e.g., a multiple or fraction) of the leakage current ILeak.

Tracking circuit 120 includes a current source 122. Current source 122 is coupled to footer circuit 130 by node 180 and path 158. Current source 122 is an electronic circuit configured to receive power supply voltage VDD2 from power supply node VDDN2, and generate current IComp. Current IComp is configured to flow from current source 122 to node 180 by path 156. In some embodiments, power supply voltage VDD2 is the same as power supply voltage VDD1. In some embodiments, power supply voltage VDD2 is different from power supply voltage VDD1. In some embodiments, power supply node VDDN2 is coupled to power supply node VDDN1.

Footer circuit 130 is coupled to tracking circuit 120 and current source 110 by path 158, and coupled to memory cell array 104 by path 154. Path 158 is coupled to path 156 by at least node 180. Footer circuit 130 is a current mirror circuit. In some embodiments, footer circuit 130 is configured to receive a current ID in path 158, and to set the current IS in path 152. The current ID in path 158 is equal to the sum of the current IComp and the current IT. In some embodiments, the current ID is equal to the current IS. The current IS in path 152 is equal to the sum of the leakage current ILeak and a write cell current Icell (Shown in FIG. 1). In some embodiments, footer circuit 130 is a write cell current limiter circuit. In some embodiments, footer circuit 130 is configured to limit or reduce the write cell current Icell during a write operation of a memory cell in memory cell array 104.

Footer circuit 130 includes a transistor N1 and a transistor N2. In some embodiments, at least transistor N1 or transistor N2 is an N-type transistor. In some embodiments, at least transistor N1 or transistor N2 is a P-type transistor.

At least a drain terminal of transistor N1 is coupled to node 180. Transistor N1 is configured as a diode having a gate terminal coupled to the drain terminal, and configured to output gate voltage VG. A source terminal of transistor N1 is coupled to power reference node VSSN.

Transistor N2 is configured to receive the output gate voltage VG from transistor N1. Each of a gate terminal of transistor N2, the gate terminal of transistor N1, the drain terminal of transistor N1, the current source 110 and the current source 122 are coupled together. A drain terminal of transistor N2 is coupled to memory cell array 104 by path 152. A source terminal of transistor N2 is coupled to power reference node VSSN.

Transistor N1 and transistor N2 form a current mirror circuit. The gate terminal and the drain terminal of transistor N1 are configured to receive current ID which sets the voltage of the gate terminal and the drain terminal of transistor N1 at a voltage VG. Since the gate terminal of transistor N1 is coupled to the gate terminal of transistor N1, the voltage VG thereby sets the voltage of the gate of transistor N2 thereby setting the current IS through transistor N2. Thus, current IS of current path 140 mirrors current ID of path 158.

In some embodiments, by including tracking circuit 120 in memory circuit 100, the current IComp generated by tracking circuit 120 tracks the leakage current ILeak during a write (programming) operation of a memory cell in memory cell array 104. In some embodiments, by tracking the leakage current ILeak during the programming operation, current IT more accurately reflects the write cell current Icell resulting in memory circuit 100 having better write performance across a range of temperatures compared with other approaches.

Figure 2:
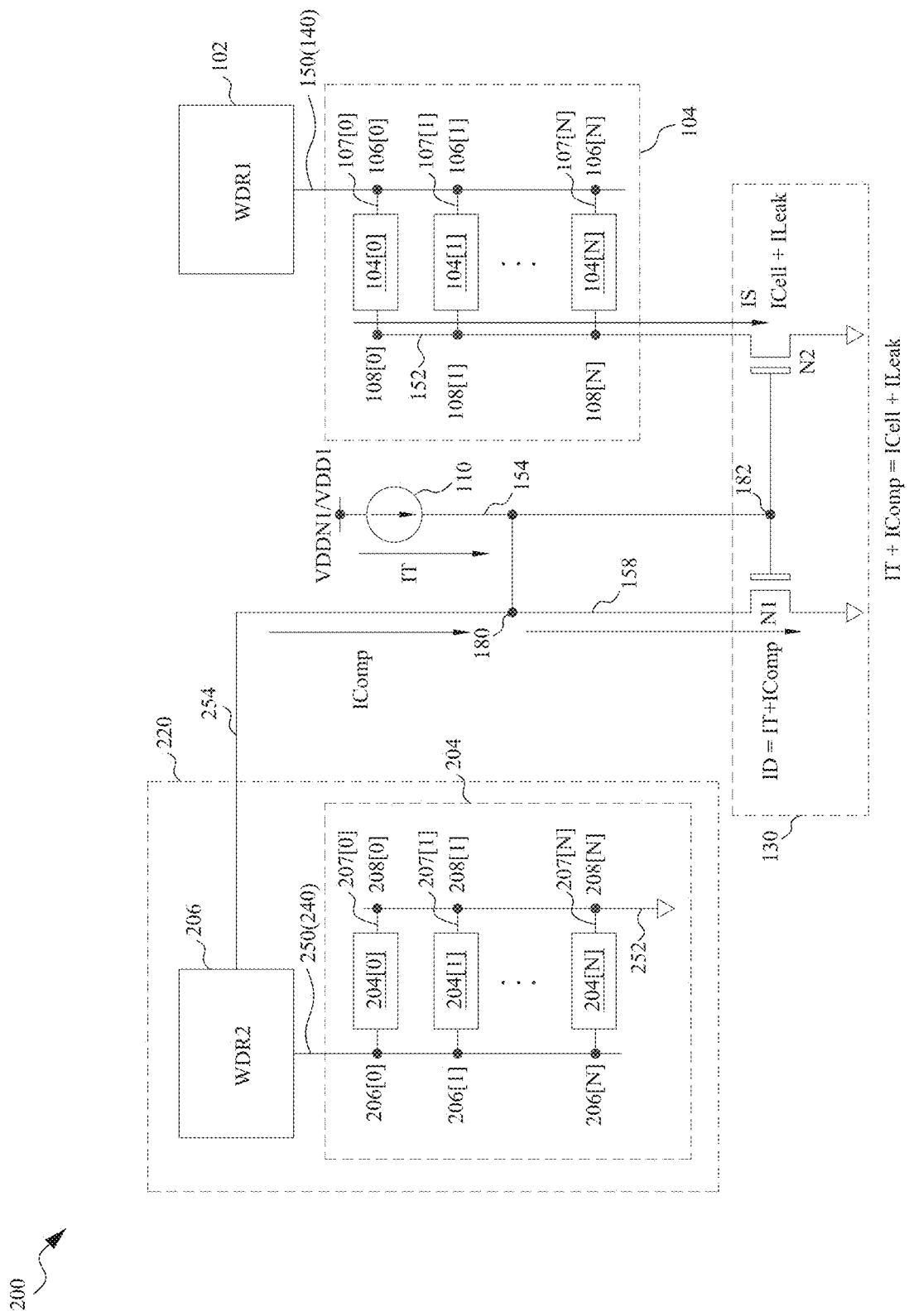
FIG. 2 is a circuit diagram of a memory circuit, in accordance with some embodiments.

FIG. 2 is a circuit diagram of a memory circuit 200, in accordance with some embodiments.

Memory circuit 200 is an embodiment of memory circuit 100 of FIG. 1, and similar detailed description is therefore omitted.

Memory circuit 200 includes tracking circuit 220 that corresponds to an embodiment of tracking circuit 120 of FIG. 1, and similar detailed description is omitted.

Memory circuit 200 includes driver circuit 102, memory cell array 104, current source 110, a tracking circuit 220 and a footer circuit 130.

Tracking circuit 220 is an embodiment of tracking circuit 120 of FIG. 1, and similar detailed description is omitted.

Tracking circuit 220 comprises a tracking cell array 204 and a driver circuit 206.

Tracking cell array 204 comprises an array of tracking cells 204[0], 204[1], . . . , 204[N] having N+1 rows, where N is a positive integer. Tracking cell array 204 is shown with a single column for brevity and ease of illustration. In some embodiments, tracking cell array 204 includes M columns, where M is a positive integer corresponding to the number of columns in tracking cell array 204.

Tracking cell array 204 further includes N+1 word lines WLD[0], . . . WLD[N] (shown in FIGS. 3A-3B for ease of illustration; collectively referred to as "word line WLD") coupled to a corresponding row of tracking cells in tracking cell array 204. Each row 0, . . . , N in tracking cell array 204 is associated with a corresponding word line WL-D[0], . . . , WLD[N]. Each word line WLD extends in the first direction X. In some embodiments, each word line WLD[0], . . . , WLD[N] in tracking cell array 204 is associated with a corresponding word line WL[0], . . . , WL[N] in memory cell array 104.

In some embodiments, tracking cell array 204 corresponds to an array of dummy RRAM cells. In some embodiments, a bit line loading of the tracking cell array 204 is equal to a bit line loading of a corresponding column of memory cell array 104, and therefore tracking cell array 204 accurately tracks the leakage current ILeak of memory cell array 104.

In some embodiments, each tracking cell 204[0], 204[1], . . . , 204[N] in tracking cell array 204 is configured to track a corresponding memory cell 104[0], 104[1], . . . , 104[N] of memory cell array 102. In some embodiments, each tracking cell 204[0], 204[1], . . . , 204[N] in tracking cell array 204 is configured to track a corresponding leakage current I0[0], I0[1], . . . , I0[N] of a corresponding memory cell 104[0], 104[1], . . . , 104[N] of memory cell array 102.

Figure 11:
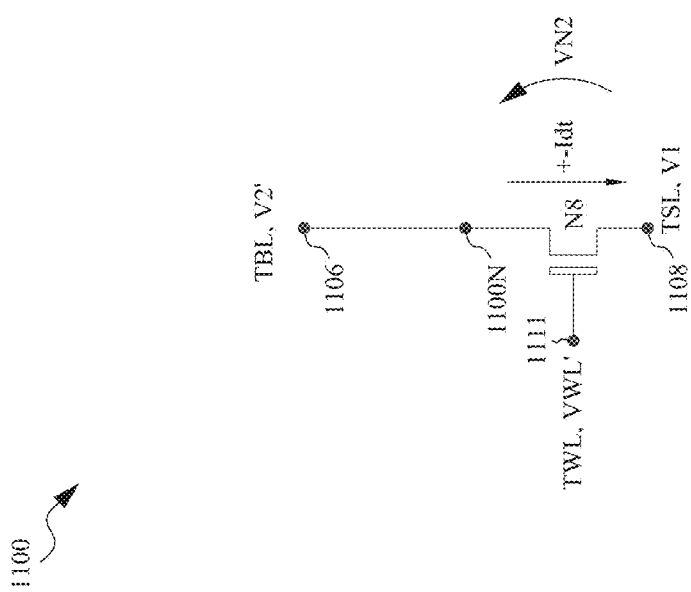
FIG. 11 is a diagram of a tracking device, in accordance with some embodiments.

The rows of cells in tracking cell array 204 are arranged in the first direction X. The columns of cells in tracking cell array 204 are arranged in the second direction Y. Tracking cell 1100 of FIG. 11 is usable as one or more tracking cells in tracking cell array 204.

Each tracking cell 204[0], 204[1], . . . , 204[N] in tracking cell array 204 is coupled between path 250 and 252 by a corresponding path 207[0], 207[1], . . . , 207[N] (collectively referred to as "path 207"). In some embodiments, each path 207[0], 207[1], . . . , 207[N] in tracking cell array 204 corresponds to each corresponding path 107[0], 107[1], . . . , 107[N] of memory cell array 102.

A first end of each tracking cell 204[0], 204[1], . . . , 204[N] in tracking cell array 204 is coupled to path 250 by a corresponding node 206[0], 206[1], . . . , 206[N] (collectively referred to as "node 206"). A second end of each tracking cell 204[0], 204[1], . . . , 204[N] in tracking cell array 204 is coupled to path 252 by a corresponding node 208[0], 208[1], . . . , 208[N] (collectively referred to as "node 208"). Path 252 is coupled between tracking cell array 204 and power reference node VSSN.

In some embodiments, each tracking cell 204[0], 204[1], . . . , 204[N] in tracking cell array 204 includes a corresponding selector element SE2 (FIG. 11) similar to corresponding selector element SE1 (FIGS. 10A-10B) of memory cell array 102.

In some embodiments, each tracking cell 204[0], 204[1], . . . , 204[N] in tracking cell array 204 corresponds to a RRAM tracking cell. In some embodiments, each tracking cell 204[0], 204[1], . . . , 204[N] in tracking cell array 204 includes a corresponding resistive switching element RE2 similar to corresponding resistive switching element RE1 (FIGS. 10A-10B) of memory cell array 102, coupled to a corresponding selector element SE2 (FIG. 11) similar to corresponding selector element SE1 (FIGS. 10A-10B) of memory cell array 102.

Different types of tracking cells in tracking cell array 204 are within the contemplated scope of the present disclosure. In some embodiments, at least tracking cell 204[0], 204[1], . . . , 204[N] in tracking cell array 204 corresponds to a MRAM tracking cell. Different configurations of tracking cell array 204 are within the contemplated scope of the present disclosure.

Driver circuit 206 is coupled to tracking cell array 204 by path 250. Driver circuit 206 is coupled to footer circuit 130 by path 254. Driver circuit 206 is configured to generate current IComp. In some embodiments, current IComp is a leakage current of tracking cell array 204 and corresponds to leakage current ILeak in memory cell array 104. In some embodiments, current IComp is referred to as a temperature compensation current since current IComp compensates for leakage current in memory cell array 104 in response to temperature changes. For example, in some embodiments, during a write operation of memory cell array 104, as a temperature of memory circuit 200 increases, the leakage current Ileak in memory cell array 104 also increases and vice versa. In these embodiments, current IComp is a temperature compensation current that compensates for the leakage current in memory cell array 104, and also increases in response to the increase in temperature. Similarly, in these embodiments, current IComp also compensates for the leakage current in memory cell array 104 in response to decreases in temperature.

In some embodiments, at least path 250 or path 207 corresponds to a tracking bit line TBL. A current path 240 is coupled between driver circuit 206 and power reference node VSSN. Current path 240 includes path 250, paths 207 and path 252. In some embodiments, current path 240 has a corresponding current IComp.

By being included in memory circuit 100 discussed above with respect to FIG. 1, tracking circuit 204 and driver circuit 206 operates to achieve the benefits discussed above with respect to memory circuit 100.

FIG. 3A is a circuit diagram of a memory circuit 300A, in accordance with some embodiments.

Memory circuit 300A is an embodiment of memory circuit 100 of FIG. 1 or memory circuit 200 of FIG. 2, and similar detailed description is therefore omitted.

Memory circuit 300A includes a driver circuit 302 that corresponds to an embodiment of driver circuit 102 of FIG. 1, and a driver circuit 306 that corresponds to an embodiment of driver circuit 206 of FIG. 2, and similar detailed description is omitted.

Memory circuit 300A includes driver circuit 302, memory cell array 104, current source 110, tracking cell array 204, a tracking circuit 320 (not labelled in FIGS. 3A-3B for ease of illustration) and footer circuit 130.

Driver circuit 302 is an embodiment of driver circuit 102 of FIG. 1, and similar detailed description is omitted. Driver circuit 302 includes an amplifier OP2 and a transistor P1 coupled between a power supply node VDDN3 and an output terminal (labelled as node 303). Current path 140 is coupled between driver circuit 302 and power reference node VSSN. Power supply node VDDN3 has a power supply voltage VDD3. In some embodiments, power supply voltage VDD3 is the same as at least power supply voltage VDD1 or VDD2. In some embodiments, power supply voltage VDD3 is different from at least power supply voltage VDD1 or VDD2. In some embodiments, power supply node VDDN3 is coupled to at least power supply node VDDN1 or VDDN2.

Two or more circuit elements are considered to be coupled based on a direct electrical connection or an electrical connection that includes one or more additional circuit elements and is thereby capable of being controlled, e.g., made resistive or open by a transistor or other switching device.

Amplifier OP2 of driver circuit 302 is an operational amplifier including an inverting input terminal configured to receive bias voltage VBLR, a non-inverting input terminal coupled to a node 303, and an output terminal coupled to a gate of transistor P1. In some embodiments, the non-inverting input terminal is configured to receive bias voltage VBLR, and the inverting input terminal is coupled to node 303.

Transistor P1 is a P-type Metal Oxide Semiconductor (PMOS) transistor having a source terminal coupled to power supply node VDDN3, a drain terminal coupled to node 303 and the non-inverting input terminal of amplifier OP2, and a gate coupled to the output of amplifier OP2. Amplifier OP2 and transistor P1 are thereby configured as a closed loop that, in operation, causes amplifier OP2 to modulate the gate of transistor P1, and thereby generate drive voltage VBL on node 303 having a voltage level equal to that of bias voltage VBLR.

As depicted in FIG. 3A, driver circuit 302 is thereby configured to output drive voltage VBL to node 303 based on received bias voltage VBLR. In some embodiments, driver circuit 302 is configured to output drive voltage VBL having a voltage level equal to that of bias voltage VBLR or having a voltage otherwise related to that of bias voltage VBLR, e.g., a multiple or fraction of bias voltage VBLR.

Tracking circuit 320 comprises tracking cell array 204, driver circuit 306 and a transistor P3. Tracking circuit 320 (not labelled in FIGS. 3A-3B for ease of illustration) is an embodiment of tracking circuit 120 of FIG. 1 or tracking circuit 220 of FIG. 2, and similar detailed description is omitted. In some embodiments, transistor P3 is not part of tracking circuit 320.

Driver circuit 306 is an embodiment of driver circuit 206 of FIG. 2, and similar detailed description is omitted. Driver circuit 306 includes an amplifier OP1 and a transistor P2 coupled between a power supply node VDDN2 and an output terminal (labelled as node 307). Current path 240 is coupled between driver circuit 306 and power reference node VSSN.

Amplifier OP1 of driver circuit 306 is an operational amplifier including an inverting input terminal configured to receive bias voltage VREFR, a non-inverting input terminal coupled to a node 307, and an output terminal coupled to a gate of transistor P2. In some embodiments, the non-inverting input terminal is configured to receive bias voltage VREFR, and the inverting input terminal is coupled to node 307.

Transistor P2 is a PMOS transistor having a source terminal coupled to power supply node VDDN2, a drain terminal coupled to node 307 and the non-inverting input terminal of amplifier OP1, and a gate coupled to the output of amplifier OP1. Amplifier OP1 and transistor P2 are thereby configured as a closed loop that, in operation, causes amplifier OP1 to modulate the gate of transistor P2, and thereby generate drive voltage VREF on node 307 having a voltage level equal to that of bias voltage VREFR.

As depicted in FIG. 3A, driver circuit 306 is thereby configured to output drive voltage VREF to node 307 based on received bias voltage VREFR. In some embodiments, driver circuit 306 is configured to output drive voltage VREF having a voltage level equal to that of bias voltage VREFR or having a voltage otherwise related to that of bias voltage VREFR, e.g., a multiple or fraction of bias voltage VREFR.

In some embodiments, bias voltage VREFR is equal to bias voltage VBLR. In some embodiments, bias voltage VREFR is different from bias voltage VBLR. In some embodiments, bias voltage VREFR is directly proportional to bias voltage VBLR. In some embodiments, bias voltage VREFR is inversely proportional to bias voltage VBLR. In some embodiments, bias voltage VREFR is a multiple or a fraction of bias voltage VBLR. In some embodiments, bias voltage VREFR is an integer multiple of bias voltage VBLR.

Transistor P3 is a PMOS transistor having a source terminal coupled to power supply node VDDN2, a drain terminal coupled to node 180, and a gate coupled to the output of amplifier OP1 and the gate of transistor P2 by a node 301.

Amplifier OP1 is coupled to the gates of transistors P2 and P3. Because amplifier OP1 drives the gate of transistor P2 and P3, current IComp is mirrored through transistors P2 and P3. Stated differently, current IComp is mirrored in each of current path 240 and current path 254 through corresponding transistors P2 and P3. By mirroring current IComp in each of current paths 240 and 254, tracking cell array 204 is able to track the leakage current of memory cell array 104 during a write operation, and driving circuit 306 is able to set current IComp as the current of current path 254. As discussed above, current IComp is combined with current IT thereby setting the current ID and IS of footer circuit 130 and achieving the benefits discussed above with respect to memory circuit 100.

In some embodiments, during a write operation of memory cell 104[0], memory cell 104[0] corresponds to a selected cell, and the other memory cells in memory cell array 104 correspond to unselected cells. In some embodiments, the word line WL[0] of the selected cell is applied a word line voltage greater than the word line voltage of the unselected cells. A current Icell passes through path 107[0] through memory cell 104[0]. However, the unselected cells generate corresponding leakage current I0[1], . . . , I0[N] that passes through corresponding path 107[1], . . . , 107[N] to path 152. Thus, the total current IS at node 152 or on path 152 is the sum of leakage current I0[1], . . . , I0[N] and current Icell.

In some embodiments, during the write operation of memory cell 104[0], each of the tracking cells of tracking cell array 204 are unselected cells, and have word line voltages equal to the word line voltages of the unselected cells in memory cell array 104.

In some embodiments, during a write operation of a selected memory cell in memory cell array 104, a corresponding tracking cell in the same row of tracking cell array 204 as memory cell array 104 is selected and applied with a same word line voltage as the word line voltage of the selected memory cell. For example, in some embodiments, during the write operation of memory cell 104[0], tracking cell 204[0] has a same word line voltage as the word line voltage of the selected memory cell 204[0], and the remaining tracking cells in tracking cell array 204 have word line voltages equal to the corresponding word line voltages of the unselected cells in memory cell array 104.

In some embodiments, each tracking cell 204[0], 204[1], . . . , 204[N] in tracking cell array 204 has a corresponding leakage current ID[0], ID[1], . . . , ID[N] that passes through corresponding path 207[0], 207[1], . . . , 207[N]. In some embodiments, the sum of the leakage current ID[0], ID[1], . . . , ID[N] is equal to current IComp.

In some embodiments, each leakage current ID[0], ID[1], . . . , ID[N] is configured to track, and is thus equal to corresponding leakage current I0[0], I0[1], . . . , I0[N]. In some embodiments, a sum (e.g., current IComp) of each of leakage current ID[0], ID[1], . . . , ID[N] is equal to a sum (e.g., leakage current ILeak) of each of leakage current I0[0], I0[1], . . . , I0[N]. In some embodiments, since current IComp is equal to leakage current Ileak, then current IT is equal to current Icell.

In some embodiments, as the temperature of memory circuit 300A increases, the leakage current ILeak increases. However, in some embodiments, since current IComp is configured to track the leakage current ILeak, as the temperature and leakage current ILeak of memory circuit 300A increases, the current IComp also increases. Thus, memory circuit 300A can accurately track the leakage current ILeak in memory circuit 300A over a range of temperatures and is better than other approaches resulting in the benefits discussed above with respect to memory circuit 100.

Figure 3B:
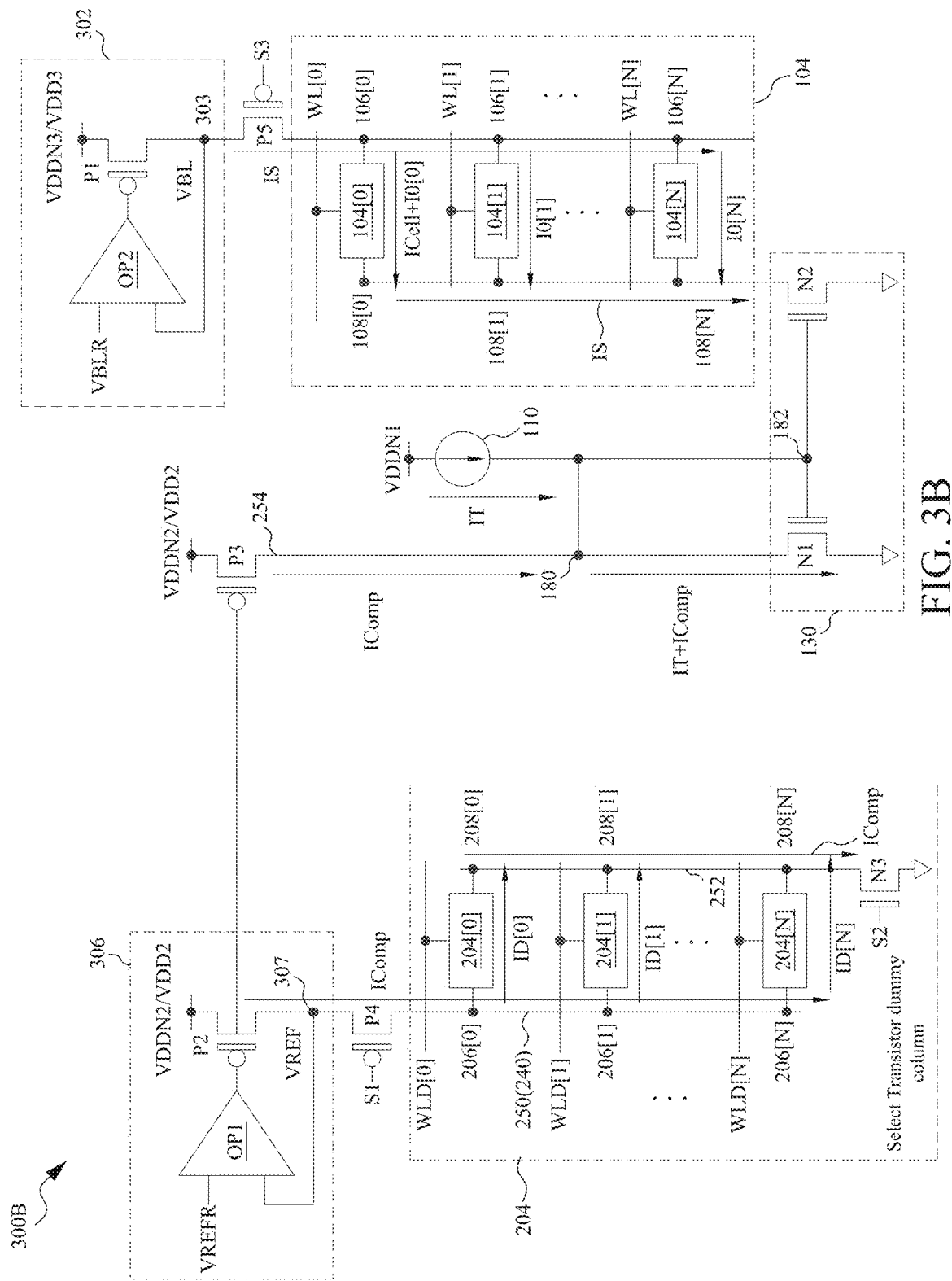
FIG. 3B is a circuit diagram of a memory circuit, in accordance with some embodiments.

FIG. 3B is a circuit diagram of a memory circuit 300B, in accordance with some embodiments.

Memory circuit 300B is an embodiment of memory circuit 100 of FIG. 1 or memory circuit 200 of FIG. 2, and similar detailed description is therefore omitted.

Memory circuit 300B is a variation of memory circuit 300A of FIG. 3A, and similar detailed description is therefore omitted. In comparison with memory circuit 300A of FIG. 3A, memory circuit 300B further includes selection transistors (e.g., transistor P4, transistor P5 and transistor N3.).

In some embodiments, at least transistor P4 or N3 is configured to select or deselect the column of tracking cells in tracking cell array 204 in response to corresponding signal S1 or S3. In some embodiments, transistor P5 is configured to select or deselect one or more columns of memory cells in memory cell array 104 in response to signal S2. In some embodiments, deselecting one or more columns of memory cells thereby reduces power and leakage current consumed by the deselected column of memory cells.

Transistor P4 is coupled between node 307 and tracking cell array 204. Transistor P4 is a PMOS transistor having a source terminal coupled to node 307, and a drain terminal coupled to path 250 and tracking cell array 204. A gate of transistor P4 is configured to receive a signal S1. In some embodiments, signal S1 has a logical level configured to control transistor P4 so as to turn on or turn off transistor P4 thereby connecting or disconnecting node 307 and tracking cell array 204. In some embodiments, at least transistor P4, transistor P5 or transistor N3 are part of a corresponding column multiplexer.

Transistor P5 is coupled between node 303 and memory cell array 104. Transistor P5 is a PMOS transistor having a source terminal coupled to node 303, and a drain terminal coupled to path 150 and memory cell array 104. A gate of transistor P5 is configured to receive a signal S3. In some embodiments, signal S3 has a logical level configured to control transistor P5 so as to turn on or turn off transistor P5 thereby connecting or disconnecting node 303 and memory cell array 104.

Transistor N3 is coupled between reference node VSSN and tracking cell array 204. Transistor N3 is an NMOS transistor having a source terminal coupled to power reference node VSSN, and a drain terminal coupled to path 252 and tracking cell array 204. A gate of transistor N3 is configured to receive a signal S2. In some embodiments, signal S2 has a logical level configured to control transistor N3 so as to turn on or turn off transistor N3 thereby connecting or disconnecting power reference node VSSN and tracking cell array 204.

Figure 4A:
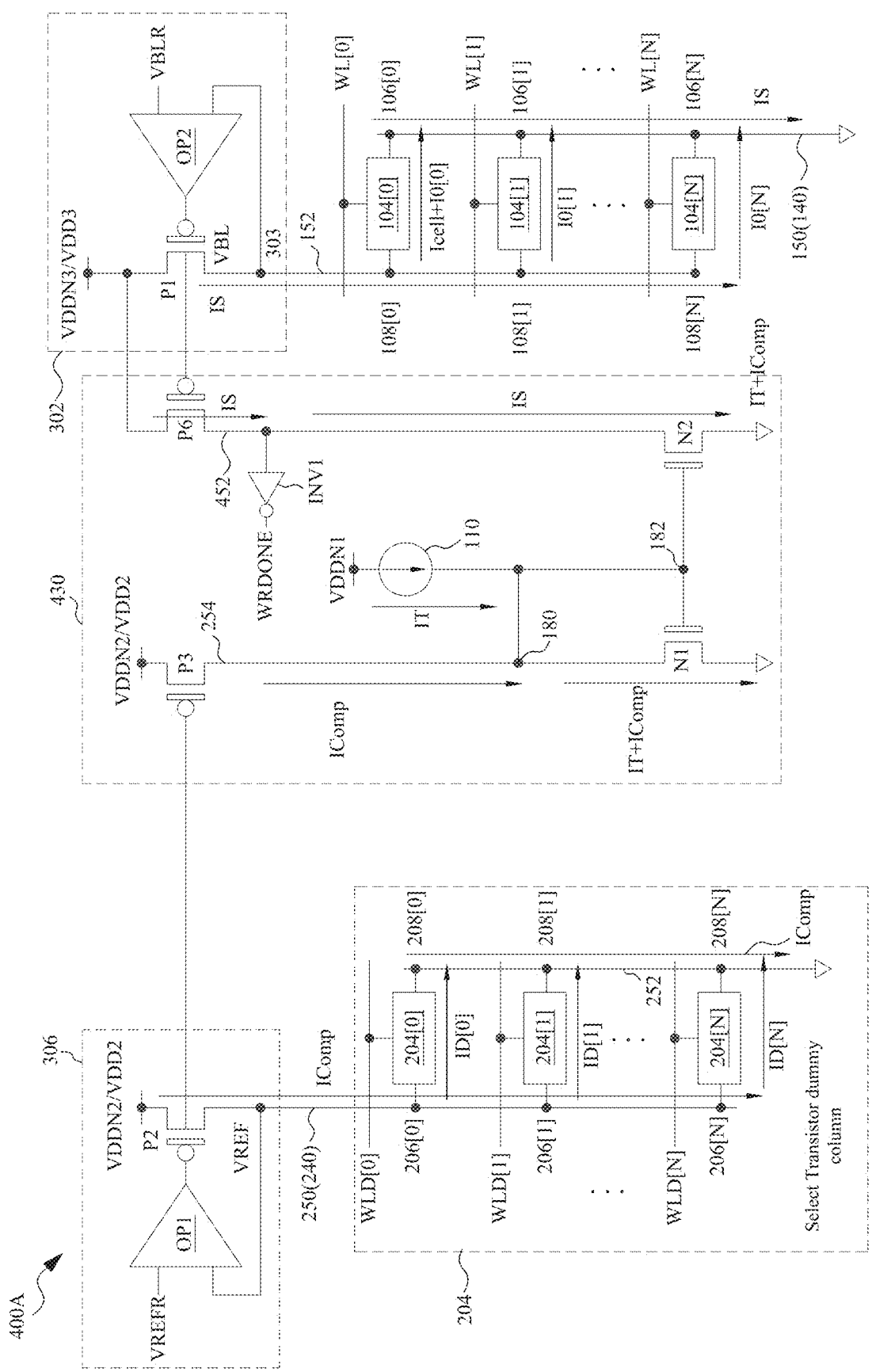
FIG. 4A is a circuit diagram of a memory circuit, in accordance with some embodiments.

FIG. 4A is a circuit diagram of a memory circuit 400A, in accordance with some embodiments.

Memory circuit 400A is an embodiment of memory circuit 100 of FIG. 1 or memory circuit 200 of FIG. 2, and similar detailed description is therefore omitted.

Memory circuit 400A is a variation of memory circuit 300A of FIG. 3A, and similar detailed description is therefore omitted. In comparison with memory circuit 300A of FIG. 3A, header circuit 430 of memory circuit 400A replaces footer circuit 130 of FIGS. 1-2 & 3A-3B, and similar detailed description is omitted. By replacing footer circuit 130 of FIG. 3A with header circuit 430, header circuit 430 is configured to reduce or limit current IS at a header location versus a footer location of footer circuit 130.

Header circuit 430 is coupled to driver circuit 302 and driver circuit 306. Header circuit 430 is configured to set and limit the current IS through path 452. In some embodiments, header circuit 430 is referred to as a header write current limiter circuit. In some embodiments, header circuit 430 is configured to mirror current IS in path 452 to be equal to the sum of current IT and IComp thereby resulting in memory circuit 400A accurately tracking the leakage current ILeak of memory cell array 104 and resulting in the benefits as described in FIG. 1. Header circuit 430 includes transistor N1, transistor N2, transistor P3, current source 110, an inverter INV1 and a transistor P6. Each of transistor N1, transistor P3, current source 110 of header circuit 430 is similar to memory circuit 100-300B, and similar detailed description is omitted.

In comparison with memory circuit 300A of FIG. 3A, transistor N2 of header circuit 430 is coupled to the driver circuit 302 through path 452. Transistor N2 of header circuit 430 is coupled to path 152 and memory cell array 104 through driver circuit 302, whereas transistor N2 of footer circuit 130 is coupled to path 152 and memory cell array 104 directly without going through driver circuit 302.

Transistor P6 is a PMOS transistor having a source terminal coupled to at least power supply node VDDN3, a drain terminal coupled to path 452 and the drain terminal of transistor N2, and a gate coupled to the output of amplifier OP2 and the gate of transistor P1. In some embodiments, the source terminal of transistor P6 is further coupled to the source terminal of transistor P1.

In comparison with memory circuit 300A of FIG. 3A, transistor P6 of header circuit 430, and amplifier OP2 and transistor P1 are configured as a closed loop that, in operation, causes amplifier OP2 to modulate the gate of transistors P1 and P6, and thereby generate drive voltage VBL on node 303 having a voltage level equal to that of bias voltage VBLR.

Amplifier OP2 is coupled to the gates of transistors P1 and P6. Because amplifier OP2 drives the gates of transistors P1 and P6, current IS is mirrored through transistors P1 and P6. Stated differently, current IS is mirrored in each of path 152 and path 452 through corresponding transistors P1 and P6. By mirroring current IS in each of paths 152 and 452, current IS in path 452 corresponds to current IS in path 152, and thereby the leakage current ILeak in memory cell array 104 is included in current IS.

In comparison with memory circuit 300A of FIG. 3A, node 303 of memory circuit 400A is coupled to memory cell array 104 by path 152. In comparison with memory circuit 300A of FIG. 3A, path 150 is not directly coupled to node 303, and path 150 is coupled to power reference node VSSN.

By replacing footer circuit 130 with header circuit 430, the connection between memory cell array 104 and node 303 is changed from path 150 to path 152, thus changing the flow of current IS. For example, by coupling node 303 to path 152, and coupling path 150 to power reference node VSSN, current IS flows from path 152 to path 150 to power reference node VSSN. Thus, the leakage current (I0[0], I0[1], . . . , I0[N]) generated by each corresponding memory cell in memory cell array 104 flows in an opposite direction from the leakage current (I0[0], I0[1], . . . , I0[N]) in memory circuits 100-300B of FIGS. 1-3B.

Inverter INV1 is coupled to the drain terminal of transistor N2 and the drain terminal of transistor P6. Inverter INV1 is configured to generate a signal WRDONE in response to current IS. An input terminal of inverter INV1 is coupled to the drain terminal of transistor N2 and the drain terminal of transistor P6. An output terminal of inverter INV1 configured to output signal WRDONE in response to current IS.

Figure 4B:
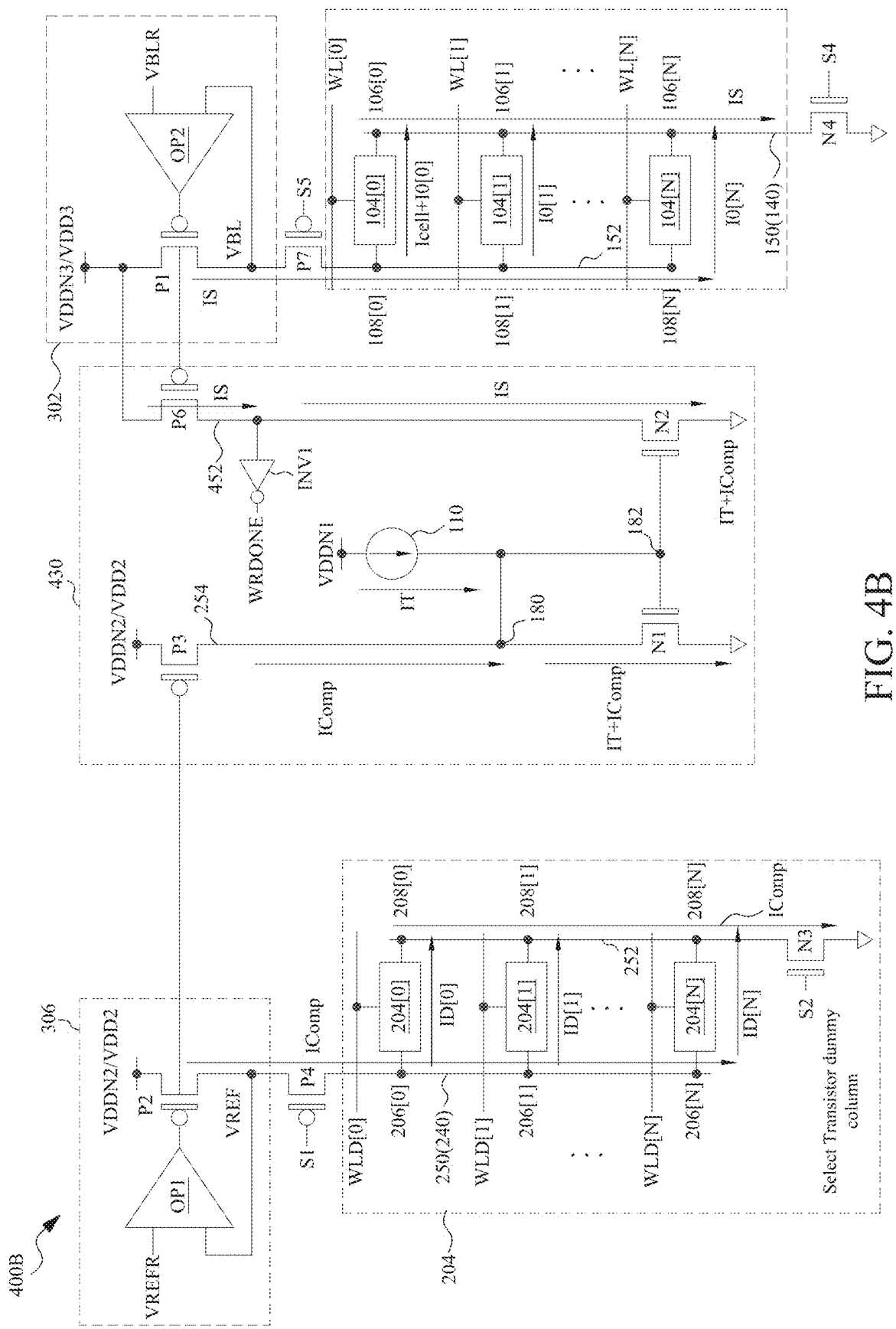
FIG. 4B is a circuit diagram of a memory circuit, in accordance with some embodiments.

FIG. 4B is a circuit diagram of a memory circuit 400B, in accordance with some embodiments.

Memory circuit 400B is an embodiment of memory circuit 100 of FIG. 1 or memory circuit 200 of FIG. 2, and similar detailed description is therefore omitted.

Memory circuit 400B is a variation of memory circuit 300B of FIG. 3B or memory circuit 400A of FIG. 4A, and similar detailed description is therefore omitted. For example, in some embodiments, memory circuit 400B combines memory circuit 400A with selection transistors (e.g., transistor P4, transistor P7, transistor N3 and transistor N4) similar to memory circuit 300B.

In comparison with memory circuit 400A of FIG. 4A, memory circuit 400B further includes transistor P4 of FIG. 3B, transistor N3 of FIG. 3B and transistors P7 and N4, and similar detailed description is therefore omitted.

Transistor P7 is coupled between node 303 and memory cell array 104. Transistor P7 is a PMOS transistor having a source terminal coupled to node 303, and a drain terminal coupled to path 152 and memory cell array 104. A gate of transistor P7 is configured to receive a signal S5. In some embodiments, signal S5 has a logical level configured to control transistor P7 so as to turn on or turn off transistor P7 thereby connecting or disconnecting node 303 and memory cell array 104 or path 152.

Transistor N4 is coupled between reference node VSSN and memory cell array 104. Transistor N4 is an NMOS transistor having a source terminal coupled to power reference node VSSN, and a drain terminal coupled to path 150 and memory cell array 104. A gate of transistor N4 is configured to receive a signal S4. In some embodiments, signal S4 has a logical level configured to control transistor N4 so as to turn on or turn off transistor N4 thereby connecting or disconnecting power reference node VSSN and at least memory cell array 104 or path 150.

In some embodiments, at least transistor P7 or N4 is configured to select or deselect one or more columns of memory cells in memory cell array 104 in response to corresponding signal S5 or S4. In some embodiments, deselecting one or more columns of memory cells thereby reduces power and leakage current consumed by the deselected column of memory cells.

Figure 5:
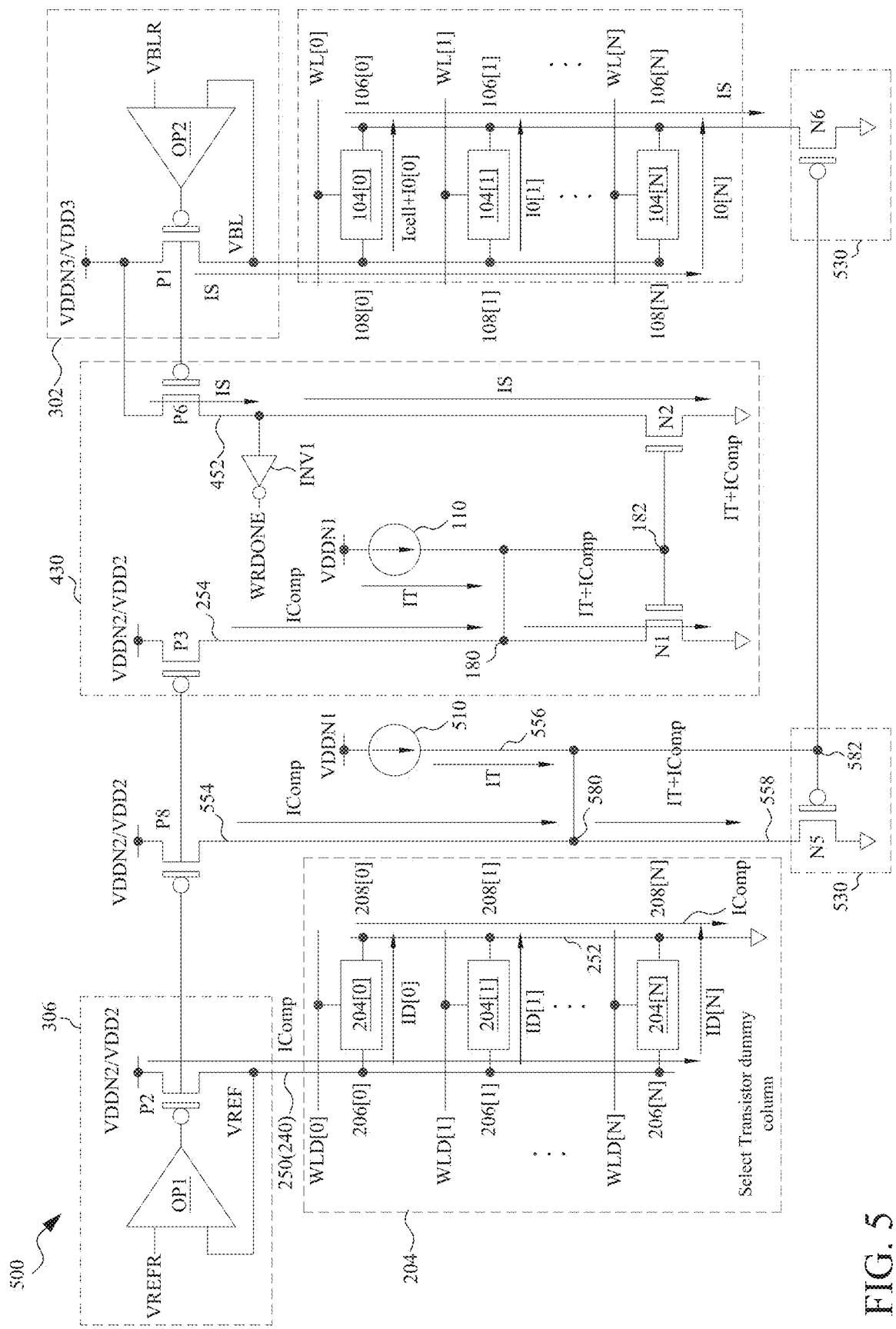
FIG. 5 is a circuit diagram of a memory circuit, in accordance with some embodiments.

FIG. 5 is a circuit diagram of a memory circuit 500, in accordance with some embodiments.

Memory circuit 500 is an embodiment of memory circuit 100 of FIG. 1 or memory circuit 200 of FIG. 2, and similar detailed description is therefore omitted.

Memory circuit 500 is a variation of memory circuit 300A of FIG. 3A and memory circuit 400A of FIG. 4A, and similar detailed description is therefore omitted. For example, in some embodiments, memory circuit 500 includes both a header circuit and a footer circuit. By including both a footer circuit and a header circuit, current IS of memory circuit 500 can be limited or reduced at both the header location and the footer location.

In comparison with memory circuit 400A of FIG. 4A, memory circuit 500 further includes a footer circuit 530, a transistor P8, a current source 510, and similar detailed description is omitted.

Footer circuit 530 is similar to footer circuit 130 of FIGS. 1-3B, transistor P8 is similar to transistor P3, current source 510 is similar to current source 110, and similar detailed description is omitted.

Current source 510 is coupled to a node 580, and coupled to footer circuit 530 by a node 582. Current source 510 is coupled to node 580 by a path 556. Current source 510 is an electronic circuit configured to receive power supply voltage VDD1 from power supply node VDDN1, and generate current IT having one or more predetermined current levels. Current IT is configured to flow from current source 510 to node 580 by path 556.

Footer circuit 530 is coupled to the drain of transistor P8, node 580, current source 510, and coupled to memory cell array 104 by path 150. Path 558 is coupled to path 556 by at least node 580. Footer circuit 530 is a current mirror circuit. In some embodiments, footer circuit 530 is configured to receive current ID in path 558, and to set the current IS in path 150.

Footer circuit 530 includes a transistor N5 and a transistor N6. In some embodiments, at least transistor N5 or transistor N6 is an N-type transistor. In some embodiments, at least transistor N5 or transistor N6 is a P-type transistor.

A drain terminal of transistor N5 is coupled to the drain of transistor P8, node 580, and current source 510. Transistor N5 is configured as a diode having a gate terminal coupled to the drain terminal, and configured to output gate voltage VG. A source terminal of transistor N5 is coupled to power reference node VSSN.

Transistor N6 is configured to receive the output gate voltage VG from transistor N5. Each of a gate terminal of transistor N6, the gate terminal of transistor N5, the drain terminal of transistor N5, and the current source 510 are coupled together. A drain terminal of transistor N6 is coupled to memory cell array 104 by path 150. A source terminal of transistor N6 is coupled to power reference node VSSN.

Transistor N5 and transistor N6 form a current mirror circuit. The gate terminal and the drain terminal of transistor N5 are configured to receive current ID which sets the voltage of the gate terminal and the drain terminal of transistor N5 at a voltage VG. Since the gate terminal of transistor N5 is coupled to the gate terminal of transistor N5, the voltage VG thereby sets the voltage of the gate of transistor N6 thereby setting the current IS through transistor N6. Thus, current IS of current path 150 mirrors current ID of path 558.

Transistor P8 is a PMOS transistor having a source terminal coupled to power supply node VDDN2, a drain terminal coupled to at least a node 580, and a gate coupled to the output of amplifier OP1, the gate of transistor P2 and the gate of transistor P3.

Amplifier OP1 is coupled to the gates of transistors P2, P3 and P8. Because amplifier OP1 drives the gates of transistors P2, P3 and P8, current IComp is mirrored through transistors P2, P3 and P8. Stated differently, current IComp is mirrored in each of current paths 240, 254 and 554 through corresponding transistors P2, P3 and P8. By mirroring current IComp in each of current paths 240, 254 and 554, tracking cell array 204 is able to track the leakage current of memory cell array 104 during a write operation, and driving circuit 306 is able to set current IComp as the current of current paths 254 and 554. As discussed above, current IComp is combined with current IT thereby setting the current ID and IS of footer circuit 530 and achieving the benefits discussed above with respect to memory circuit 100.

Figure 6A:
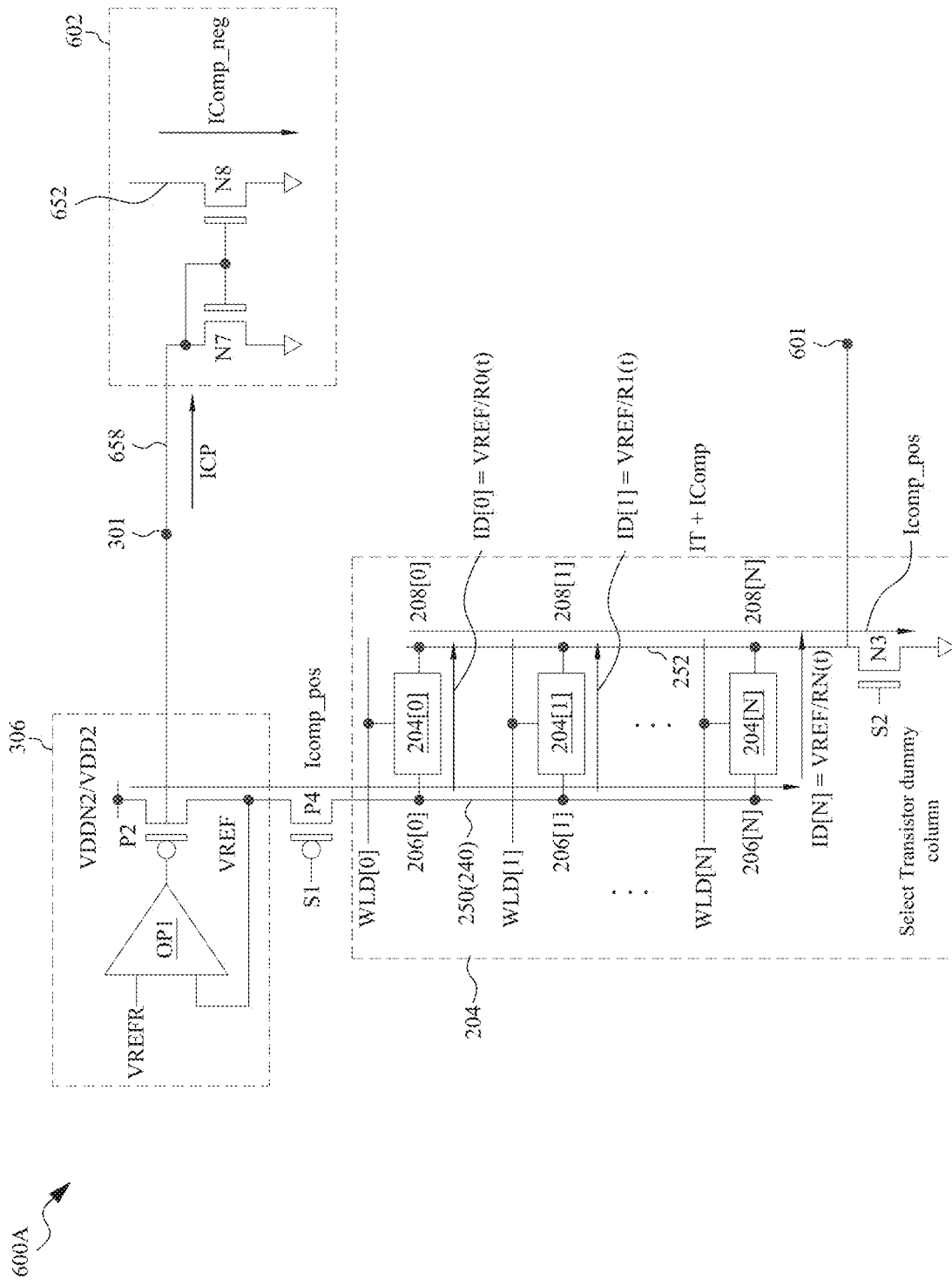
FIG. 6A is a circuit diagram of a memory circuit, in accordance with some embodiments.

FIG. 6A is a circuit diagram of a memory circuit 600A, in accordance with some embodiments. FIGS. 6B, 6C and 6D are corresponding waveforms 600B, 600C and 600D generated by memory circuit 600A, in accordance with some embodiments.

Memory circuit 600A is an embodiment of memory circuit 100 of FIG. 1 or memory circuit 200 of FIG. 2, and similar detailed description is therefore omitted.

Memory circuit 600A is useable to track the real-time leakage current (e.g., IComp_pos or IComp_neg) in tracking cell array 204. By tracking the real-time leakage current in tracking cell array 204, the real-time cell degradation of in tracking cell array 204 in response to temperature changes can be tracked in real-time.

In some embodiments, memory circuit 600A of FIG. 6A is simplified for ease of illustration. For example, in some embodiments, memory circuit 600A also includes other circuits previously described (e.g., at least driver circuit 302, memory cell array 104, footer circuit 130, header circuit 430 or footer circuit 530) that are not shown or described for simplicity.

Memory circuit 600A is a variation of memory circuit 300B of FIG. 3B, and similar detailed description is therefore omitted. In comparison with memory circuit 300B of FIG. 3B, memory circuit 600A further includes a negative current tracking circuit (e.g., current tracking circuit 602), and similar detailed description is omitted.

Current tracking circuit 602 is coupled to node 301 (also shown in FIGS. 3A-3B), the gate of transistor P2 and the output of amplifier OP1 by path 658. Current tracking circuit 602 is a current mirror circuit. In some embodiments, current tracking circuit 602 is configured to receive a current ICP in path 658, and to set the current IComp_neg in path 652. In some embodiments, the current ICP is equal to the current IComp_neg.

Current tracking circuit 602 includes a transistor N7 and a transistor N8. Transistor N7 and transistor N8 form a current mirror circuit. The gate terminal and the drain terminal of transistor N7 are configured to receive current ICP which sets the voltage of the gate terminal and the drain terminal of transistor N7 at a voltage VG2. Since the gate terminal of transistor N7 is coupled to the gate terminal of transistor N8, the voltage VG2 thereby sets the voltage of the gate of transistor N8 thereby setting the current IComp_neg through transistor N8. Thus, current IComp_neg of current path 654 mirrors current ICP of path 658, and vice versa.

As discussed above, memory circuit 600A is useable to track the real-time current IComp_pos in path 252. For example, in some embodiments, the real-time current IComp_pos in path 252 is the positive real-time current and is output by node 601. Thus, memory circuit 600A can be used to track the real-time leakage current in path 252 of tracking circuit 204.

In some embodiments, real-time current IComp_pos in path 252 is the sum of leakage current ID[0], ID[1], . . . , ID[N]. In some embodiments, at least leakage current ID[0], ID[1], . . . , ID[N] of corresponding tracking cell 204[0], 204[1], . . . , 204[N] varies with temperature and has a profile as shown in FIGS. 6B, 6C and 6D.

Leakage current ID[0], ID[1], . . . , ID[N] is equal to voltage VREF divided by the corresponding resistance R0($t$), R1($t$), . . . , RN($t$) of corresponding tracking cell 204[0], 204[1], . . . , 204[N]. For example, in some embodiments, at least resistance R0($t$), R1($t$), . . . , RN($t$) varies with temperature thereby causing at least corresponding leakage current ID[0], ID[1], . . . , ID[N] to vary with temperature as well. In some embodiments, the resistance R0($t$), R1($t$), . . . , RN($t$) of corresponding tracking cell 204[0], 204[1], . . . , 204[N] is a corresponding temperature-coefficient of resistance (TCR) that increases or decreases with an increasing temperature.

In some embodiments, leakage current IComp_pos of each tracking cell 204[0], 204[1], . . . , 204[N] in tracking cell array 204 varies with temperature and has a real-time positive leakage current profile (shown in FIG. 6B). In some embodiments, a positive leakage current profile includes a leakage current that increases in value as the temperature of the tracking cell also increases, and is shown in FIG. 6B. As shown in FIG. 6B, as the real-time temperature of the tracking cell increases, the real-time leakage current also increases in value. In some embodiments, the current tracking circuit 602 and transistors P4 and N3 are not included in FIG. 6A. In these embodiments, the real-time current IComp_pos in path 252 is tracked by tracking circuit 204, corresponds to the positive real-time current, and is output by node 601.

As discussed above, memory circuit 600A is useable to track the real-time current IComp_neg in path 654. In some embodiments, real-time current IComp_neg is the inverse of real-time current IComp_pos. In some embodiments, the inverse real-time current IComp_neg in path 654 is the negative real-time current and is output by circuit 602. Thus, memory circuit 600A can be used to track the real-time leakage current IComp_neg in path 654 of current tracking circuit 602.

In some embodiments, leakage current IComp_pos of each tracking cell 204[0], 204[1], . . . , 204[N] in tracking cell array 204 varies with temperature and has a real-time negative leakage current profile (shown in FIG. 6C). In some embodiments, a negative leakage current profile includes a leakage current that decreases in value as the temperature of the tracking cell increases, and is shown in FIG. 6C. As shown in FIG. 6C, as the real-time temperature of the tracking cell increases, the real-time leakage current decreases in value.

In some embodiments, leakage current IComp_pos of each tracking cell 204[0], 204[1], . . . , 204[N] in tracking cell array 204 varies with temperature and has both a positive leakage current profile and a negative leakage current profile (shown in FIG. 6D). As shown in FIG. 6D, as the real-time temperature of the tracking cell increases, the real-time leakage current increases in value until a temperature T1. However, after temperature T1, as the real-time temperature of the tracking cell increases beyond temperature T1, the real-time leakage current decreases in value. Thus, as shown in FIG. 6D, the real-time leakage current profile is a hybrid of the real-time positive leakage current profile and the real-time negative leakage current profile.

Thus, in some embodiments, memory circuit 600A is useable to track the real-time leakage current (e.g., IComp_pos or IComp_neg) in tracking cell array 204, and can accurately track the real-time cell degradation of tracking cell array 204 in response to increasing or decreasing temperature changes in real-time.

Figure 7:
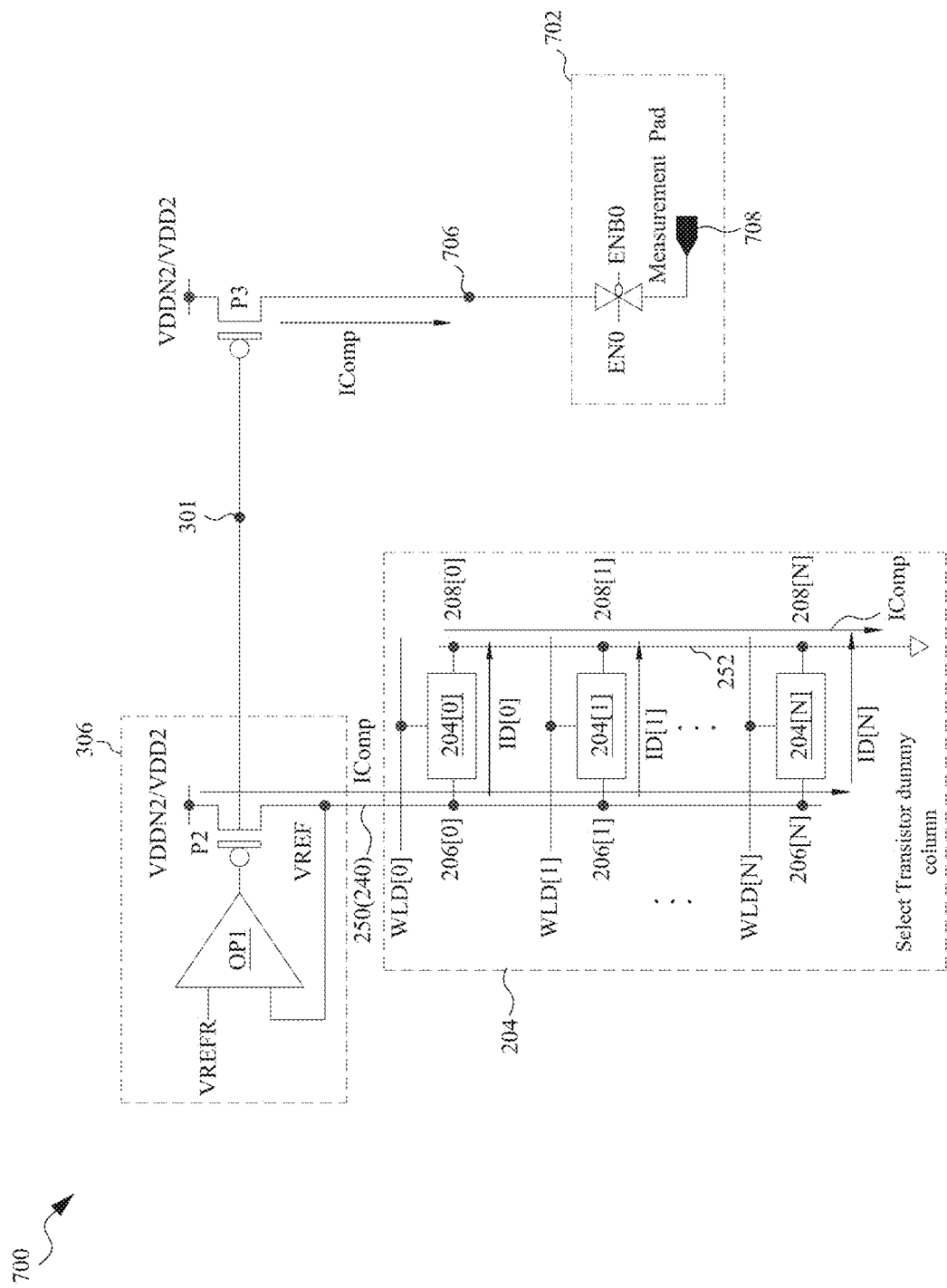
FIG. 7 is a circuit diagram of a memory circuit, in accordance with some embodiments.

FIG. 7 is a circuit diagram of a memory circuit 700, in accordance with some embodiments.

Memory circuit 700 is an embodiment of memory circuit 100 of FIG. 1 or memory circuit 200 of FIG. 2, and similar detailed description is therefore omitted.

Memory circuit 700 is a variation of memory circuit 300A of FIG. 3A, and similar detailed description is therefore omitted. For example, in some embodiments, memory circuit 700 can be used as a process corner detection circuit.

In comparison with memory circuit 300A of FIG. 3A, memory circuit 700 further includes a measurement circuit 702 coupled to transistor P3, and similar detailed description is omitted.

In some embodiments, memory circuit 700 of FIG. 7 is simplified for ease of illustration. For example, in some embodiments, memory circuit 700 also includes other circuits previously described (e.g., at least driver circuit 302, memory cell array 104, footer circuit 130, header circuit 430 or footer circuit 530) that are not shown or described for simplicity.

Measurement circuit 702 is coupled to the source of transistor P3 by a node 706. Measurement circuit 702 is configured to measure the current IComp which is the leakage current of tracking cell array 204.

For example, in some embodiments, memory circuit 700 can be used as a process corner detection circuit. In some embodiments, different process corner variations will cause different column leakage currents. Thus, by using memory circuit 700, the leakage current from tracking cell array 204 can be tracked, and measurement circuit 702 can measure the leakage current IComp from tracking cell array 204. By measuring the leakage current IComp, the impact of process corner variations can be accurately tracked, and voltages can be increased or decreased to cancel the process corner variations. In some embodiments, by cancelling process corner variations causes memory circuit 700 to have improved performance compared to other approaches that do not accurately track process corner variations.

Measurement circuit 702 includes a transmission gate TG0 coupled to a measurement pad 708. Transmission gate TG0 is coupled between node 706 and measurement pad 708. Transmission gate TG0 has a first input terminal configured to receive an enable signal EN0, a second input terminal configured to receive an inverted enable signal ENB0, and a third input terminal configured to receive leakage current ILeak from the drain of transistor P3. Transmission gate TG0 has an output terminal configured to output leakage current ILeak to measurement pad 708. In some embodiments, at least enable signal EN0 or inverted enable signal ENB0 is generated by an external circuit (not shown).

Transmission gate TG0 is enabled (e.g., turned on) or disabled (e.g., turned off) in response to enable signal EN0 and inverted enable signal ENB0. If disabled, transmission gate TG0 does not pass or output the leakage current ILeak to measurement pad 708. If enabled, transmission gate TG0 is configured to output or pass the leakage current ILeak to at least measurement pad 708. For example, in some embodiments, if transmission gate TG0 is enabled, then a voltage of measurement pad 708 can be set, and the leakage current ILeak is measured thereby determining the current IComp. Other types of circuits are usable for measurement circuit 702 and are within the scope of the present disclosure.

Figure 8A:
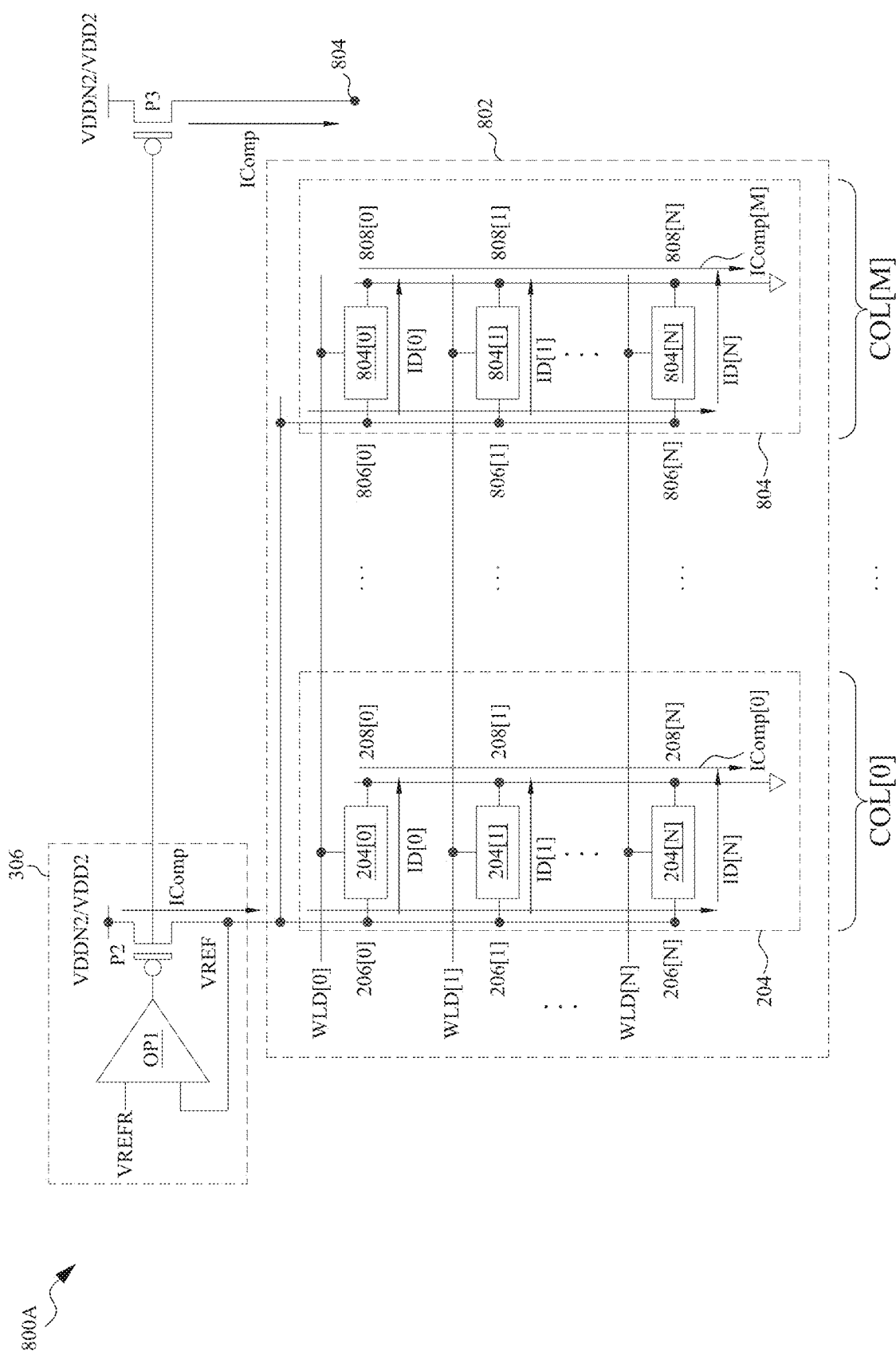
FIG. 8A is a circuit diagram of a memory circuit, in accordance with some embodiments.

FIG. 8A is a circuit diagram of a memory circuit 800A, in accordance with some embodiments.

Memory circuit 800A is an embodiment of memory circuit 100 of FIG. 1 or memory circuit 200 of FIG. 2, and similar detailed description is therefore omitted.

Memory circuit 800A is an example where tracking cell array has more than 1 column of tracking cells.

Memory circuit 800A is a variation of memory circuit 300A of FIG. 3A, and similar detailed description is therefore omitted. In comparison with memory circuit 300A of FIG. 3A, where tracking cell array 802 replaces tracking cell array 204, and similar detailed description is omitted.

Tracking cell array 802 includes tracking cell array 204 and tracking cell array 804. In comparison with memory circuit 300A of FIG. 3A, tracking cell array 204 of FIGS. 8A-8B has a current IComp[0], and similar detailed description is omitted.

Tracking cell array 802 comprises an array of tracking cells having N+1 rows and M+1 columns. Each of the columns of tracking cells in tracking cell array 802 has a corresponding current IComp[0], . . . , IComp[M]. The current IComp of tracking cell array 802 is equal to the sum of current IComp[0], . . . , IComp[M] from each corresponding column of tracking cells in tracking cell array 802.

Tracking cell array 804 is similar to tracking cell array 204, and similar detailed description is omitted.

Tracking cell array 804 includes columns of tracking cells 804[0], 804[2], . . . , 804[N] coupled between corresponding node 806[0], 806[2], . . . , 806[N] and corresponding node 808[0], 808[2], . . . , 808[N]. In some embodiments, each tracking cell 804[0], 804[1], . . . , 804[N] in tracking cell array 804 has a corresponding leakage current ID[0]', ID[1]', . . . , ID[N]' that passes through corresponding path 807[0], 807[1], . . . , 807[N]. In some embodiments, the sum of the leakage current ID[0]', ID[1]', . . . , ID[N]' is equal to current IComp[M].

In some embodiments, one or more tracking cells 804[0], 804[2], . . . , 804[N] are similar to corresponding tracking cells 204[0], 204[2], . . . , 204[N], leakage current ID[0]', ID[1]', . . . , ID[N]' is similar to corresponding leakage current ID[0], ID[1], . . . , ID[N], node 806[0], 806[2], . . . , 806[N] is similar to corresponding node 206[0], 206[2], . . . , 206[N], or node 808[0], 808[2], . . . , 808[N] is similar to corresponding node 208[0], 208[2], . . . , 208[N], and similar detailed description is omitted.

Tracking cell array 804 is shown with a single column (e.g., column M). Other numbers of columns are within the scope of the present disclosure.

By including other numbers of columns in tracking cell array 802, memory circuit 800A has a leakage current IComp that is based on leakage current values IComp[0], . . . , IComp[M] of a larger number of tracking cells than other approaches, resulting in a wider range of leakage current values that can be used in compensating for the leakage current in memory circuit 800A or 800B. Thus, memory circuit 800A or 800B can more accurately track the leakage current ILeak in memory circuit 800A or 800B than other approaches resulting in the benefits discussed above with respect to memory circuit 100.

Figure 8B:
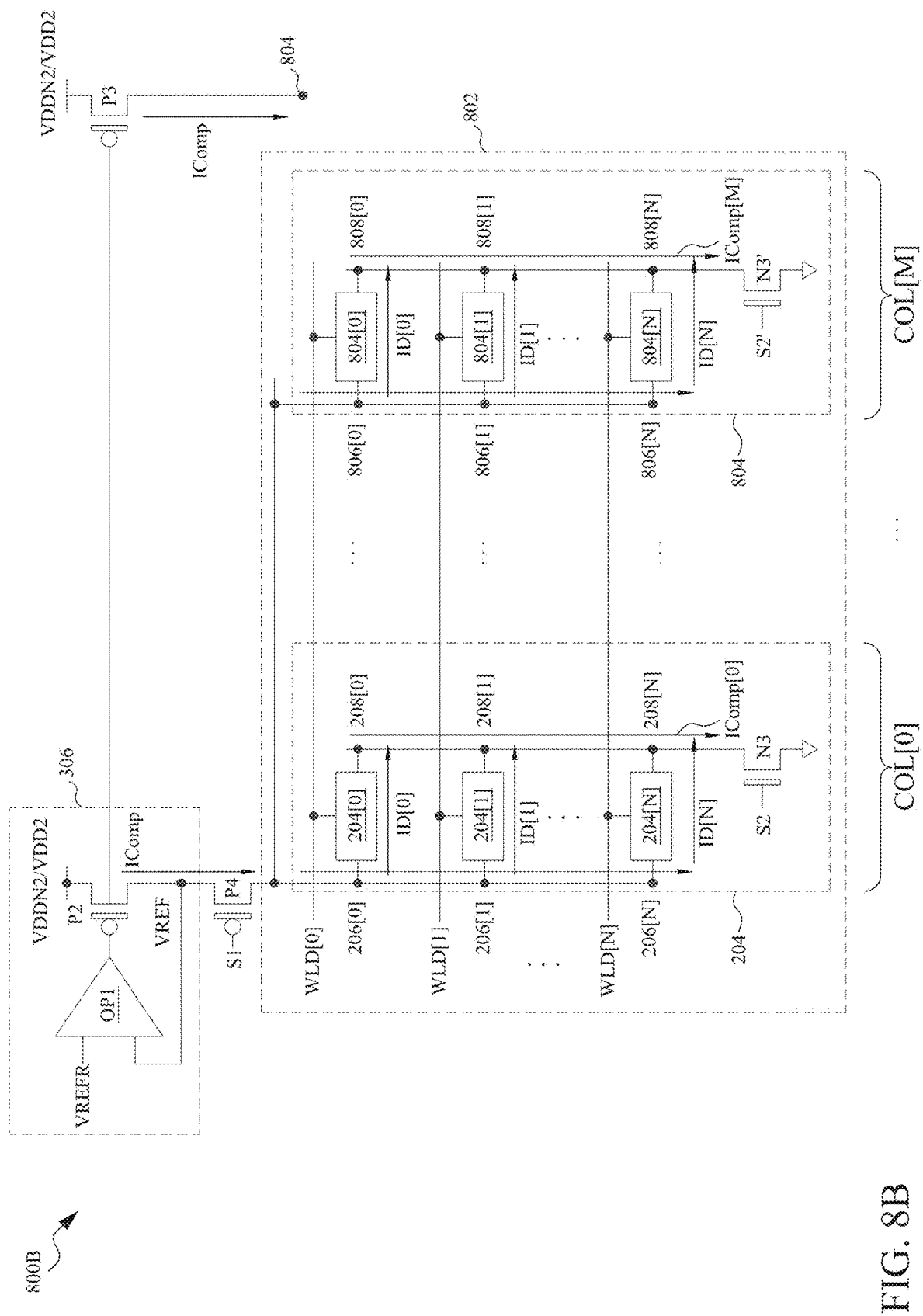
FIG. 8B is a circuit diagram of a memory circuit, in accordance with some embodiments.

FIG. 8B is a circuit diagram of a memory circuit 800B, in accordance with some embodiments.

Memory circuit 800B is an embodiment of memory circuit 100 of FIG. 1 or memory circuit 200 of FIG. 2, and similar detailed description is therefore omitted.

Memory circuit 800B is an example where memory circuit 800A of FIG. 8A further includes selection transistors (e.g., transistor P4, transistor N3 and transistor N3').

In comparison with memory circuit 800A of FIG. 8A, memory circuit 800B further includes transistor P4 of FIG. 3B, transistor N3 of FIG. 3B and transistor N3', and similar detailed description is therefore omitted.

In some embodiments, at least transistor P4, N3 or N3' is configured to select or deselect the column of tracking cells in tracking cell array 802 in response to corresponding signal S1, S2 or S2'. In some embodiments, deselecting one or more columns of tracking cells thereby reduces power and leakage current consumed by the deselected column of tracking cells.

Transistor N3' is coupled between reference node VSSN and tracking cell array 804. Transistor N3' is an NMOS transistor having a source terminal coupled to power reference node VSSN, and a drain terminal coupled to path 252 and tracking cell array 804. A gate of transistor N3 is configured to receive a signal S3'. In some embodiments, signal S3' has a logical level configured to control transistor N3' so as to turn on or turn off transistor N3' thereby connecting or disconnecting power reference node VSSN and tracking cell array 804.

Figure 9A:
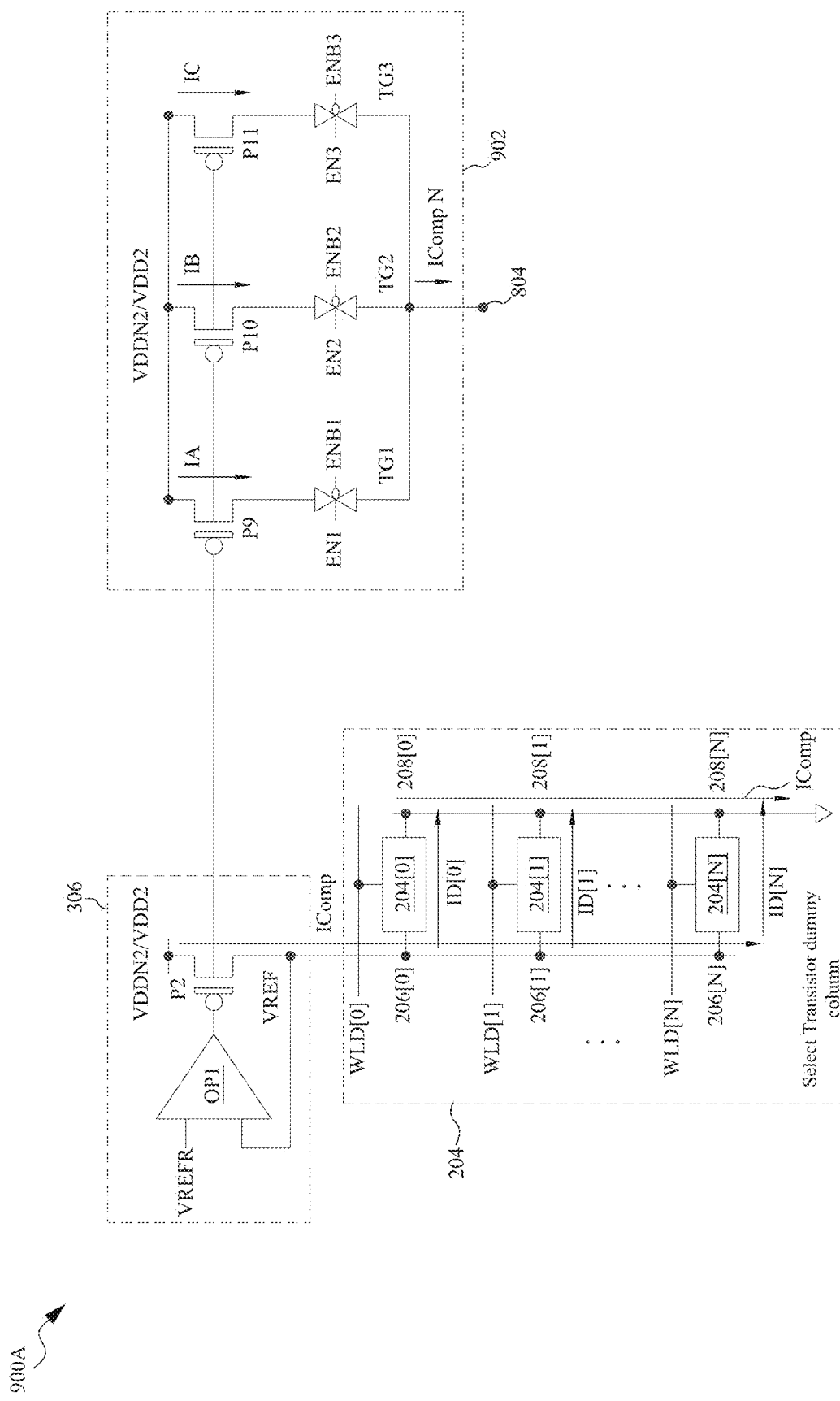
FIG. 9A is a circuit diagram of a memory circuit, in accordance with some embodiments.

FIG. 9A is a circuit diagram of a memory circuit 900A, in accordance with some embodiments.

Memory circuit 900A is an embodiment of memory circuit 100 of FIG. 1 or memory circuit 200 of FIG. 2, and similar detailed description is therefore omitted.

Memory circuit 900A is an example where one or more additional transistors are added to adjust the temperature compensation current (e.g., current IComp_N).

Memory circuit 900A is a variation of memory circuit 300A of FIG. 3A, and similar detailed description is therefore omitted. In comparison with memory circuit 300A of FIG. 3A, circuit 902 replaces transistor P3, current IComp_N replaces current IComp in path 254 of FIG. 3A, and similar detailed description is omitted.

Circuit 902 includes a transistor P9, a transistor P10, a transistor P11, a transmission gate TG1, a transmission gate TG2, and a transmission gate TG3. In some embodiments, at least transistor P9, transistor P10 or transistor P11 is similar to transistor P3, and similar detailed description is omitted.

Transistor P9 is a PMOS transistor having a source terminal coupled to power supply node VDDN2 and a drain terminal coupled to an input terminal of transmission gate TG1.

Transistor P10 is a PMOS transistor having a source terminal coupled to power supply node VDDN2 and a drain terminal coupled to an input terminal of transmission gate TG2.

Transistor P11 is a PMOS transistor having a source terminal coupled to power supply node VDDN2 and a drain terminal coupled to an input terminal of transmission gate TG3.

Each of the output of amplifier OP1, the gate of transistor P2, a gate of transistor P9, a gate of transistor P10 and a gate of transistor P11 are coupled together. Amplifier OP1 is coupled to the gates of transistors P2, P9, P10 and P11. Because amplifier OP1 drives the gates of transistors P2, P9, P10 and P11, current IComp is mirrored through transistors P9, P10 and P11 as corresponding current IA, IB or IC. Stated differently, current IComp in path 250 is mirrored as current IA, IB or IC in corresponding transistor P9, P10 and P11. However, in some embodiments, dependent upon at least the dimensions of corresponding transistor P9, P10 and P11, affects whether at least current IA, IB or IC is equal to current IComp. In some embodiments, at least current IA, IB or IC is equal to current IComp. In some embodiments, at least current IA, IB or IC is different from current IComp. In some embodiments, at least dimensions of corresponding transistor P9, P10 or P11 are equal to at least corresponding dimensions of another corresponding transistor P9, P10 or P11. In some embodiments, at least dimensions of corresponding transistor P9, P10 or P11 are different from at least corresponding dimensions of another corresponding transistor P9, P10 or P11. In some embodiments, dimensions, include channel length, channel width, number of fins, or the like.

Transmission gate TG1 is coupled between the drain of transistor P9 and node 804. Transmission gate TG1 has a first input terminal configured to receive an enable signal EN1, a second input terminal configured to receive an inverted enable signal EN1B, and a third input terminal configured to receive current IA from transistor P9. Transmission gate TG1 has an output terminal configured to output current IA.

Transmission gate TG1 is enabled (e.g., turned on) or disabled (e.g., turned off) in response to enable signal EN1 and inverted enable signal EN1B. If enabled, transmission gate TG1 is configured to output or pass the current IA to at least node 804. If disabled, transmission gate TG1 does not pass or output the current IA to node 804.

Transmission gate TG2 is coupled between the drain of transistor P10 and node 804. Transmission gate TG2 has a first input terminal configured to receive an enable signal EN2, a second input terminal configured to receive an inverted enable signal EN2B, and a third input terminal configured to receive current IB from transistor P10. Transmission gate TG2 has an output terminal configured to output current IB.

Transmission gate TG2 is enabled (e.g., turned on) or disabled (e.g., turned off) in response to enable signal EN2 and inverted enable signal EN2B. If enabled, transmission gate TG2 is configured to output or pass the current IB to at least node 804. If disabled, transmission gate TG2 does not pass or output the current IB to node 804.

Transmission gate TG3 is coupled between the drain of transistor P11 and node 804. Transmission gate TG3 has a first input terminal configured to receive an enable signal EN3, a second input terminal configured to receive an inverted enable signal EN3B, and a third input terminal configured to receive current IC from transistor P11. Transmission gate TG3 has an output terminal configured to output current IC.

Transmission gate TG3 is enabled (e.g., turned on) or disabled (e.g., turned off) in response to enable signal EN3 and inverted enable signal EN3B. If enabled, transmission gate TG3 is configured to output or pass the current IC to at least node 804. If disabled, transmission gate TG3 does not pass or output the current IC to node 804.

In some embodiments, at least enable signal EN1, enable signal EN2, enable signal EN3, inverted enable signal EN1B, inverted enable signal EN2B or inverted enable signal EN3B is generated by an external circuit (not shown) of memory circuit 900A.

A current at node 804 is current IComp_N. In some embodiments, current IComp_N is equal to the sum of current IA, IB and IC. In some embodiments, current IComp_N is equal to at least current IA, IB or IC or current IComp. In some embodiments, IComp_N is greater than current IComp. In some embodiments, IComp_N is less than current IComp.

By selecting at least enable signal EN1 or inverted enable signal EN1B, enable signal EN2 or inverted enable signal EN2B or enable signal EN3 or inverted enable signal EN1B, corresponding transmission gate TG1, TG2 or TG3 can be turned on or off thereby adjusting the current IComp_N at node 804. By adjusting the current at node 804, different ratios of current values can be used to track the leakage current of tracking circuit 204 resulting in a wider range of leakage current values that can be used to compensate for the leakage current in memory circuit 900A or 900B. Thus, memory circuit 900A or 900B can more accurately track the leakage current ILeak in memory circuit 900A or 900B than other approaches resulting in the benefits discussed above with respect to memory circuit 100.

Figure 9B:
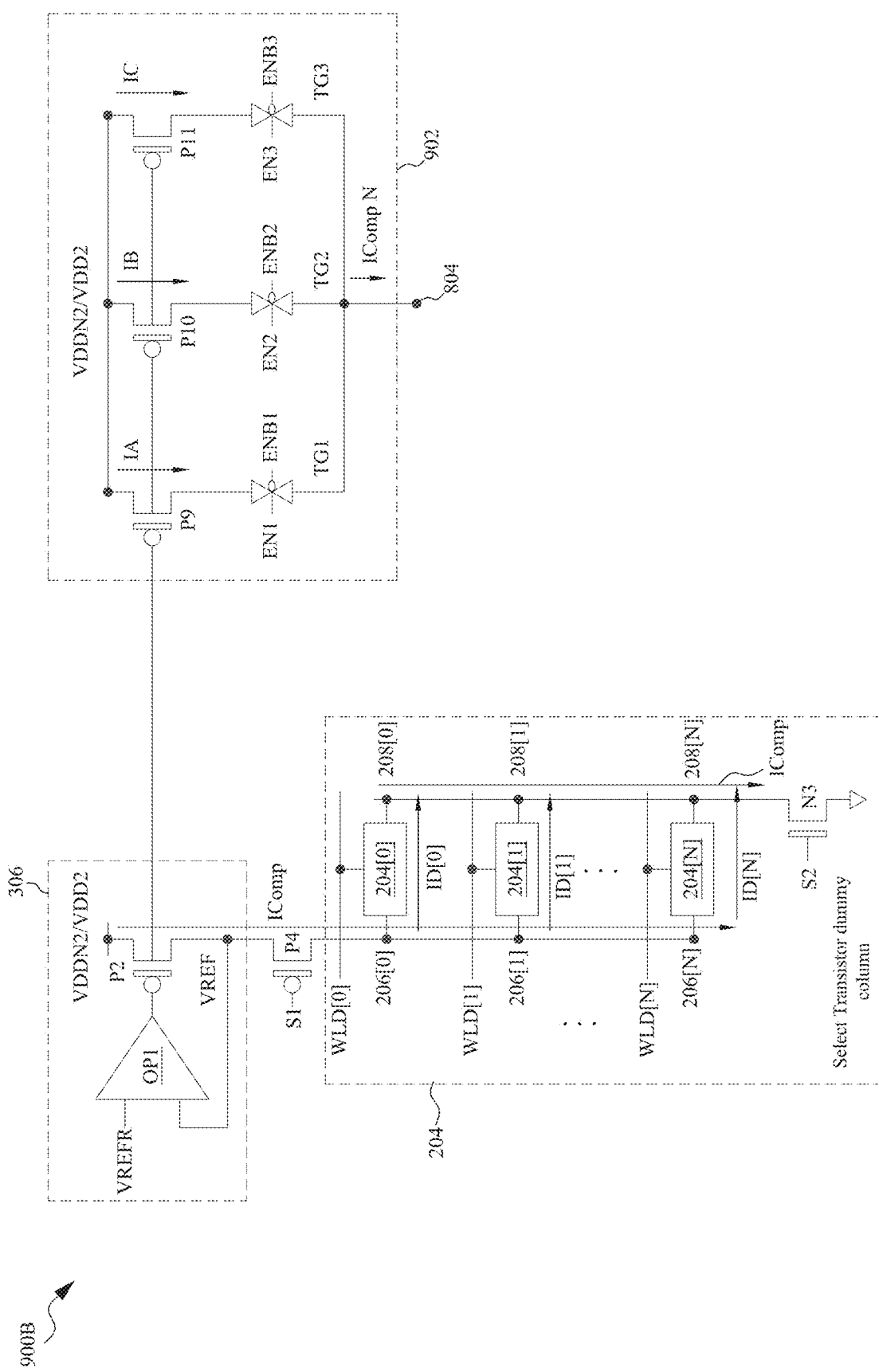
FIG. 9B is a circuit diagram of a memory circuit, in accordance with some embodiments.

FIG. 9B is a circuit diagram of a memory circuit 900B, in accordance with some embodiments.

Memory circuit 900B is an embodiment of memory circuit 100 of FIG. 1 or memory circuit 200 of FIG. 2, and similar detailed description is therefore omitted.

Memory circuit 900B is an example where memory circuit 900A of FIG. 9A further includes selection transistors (e.g., transistor P4 and transistor N3).

In comparison with memory circuit 900A of FIG. 9A, memory circuit 900B further includes transistor P4 of FIG. 3B, and transistor N3 of FIG. 3B, and similar detailed description is therefore omitted. In some embodiments, at least transistor P4 or N3 is configured to select or deselect the column of tracking cells in tracking cell array 204 in response to corresponding signal S1 or S2. In some embodiments, deselecting one or more columns of tracking cells thereby reduces power and leakage current consumed by the deselected column of tracking cells.

FIG. 10A is a diagram of RRAM device 1000, in accordance with some embodiments. RRAM device 1000 is usable as part or all of one or more memory cells of memory cell array 104, discussed above with respect to FIG. 1.

RRAM device 1000 includes input terminal 1010 configured to receive word line voltage VWL and terminals 1008 and 1006 configured to have respective voltages V1 and V2 and to conduct current Id, each discussed above with respect to FIG. 1. RRAM device 1000 also includes a selection transistor N7 coupled in series with a variable resistance structure RE1 at a node 1000N. In the embodiment depicted in FIG. 10A, selection transistor N7 is coupled between terminal 1008 and variable resistance structure RE1. In some embodiments, selection transistor N7 is coupled between terminal 1006 and variable resistance structure RE1.

In some embodiments, terminal 1006 corresponds to at least node 106[0], 106[1], . . . , 106[N] and terminal 1008 corresponds to at least node 108[0], 108[1], . . . , 108[N], and similar detailed description is therefore omitted. In some embodiments, terminal 1010 corresponds to a node (not labelled) where each memory cell 104[0], 104[1], . . . , 104[N] is coupled to corresponding word line WL[0], WL[1], . . . , WL[N], and similar detailed description is therefore omitted. In some embodiments, word line voltage VWL corresponds to at least a word line voltage of corresponding word line WL[0], WL[1], . . . , WL[N], and current Id corresponds to at least current I0[0], I0[1], . . . , I0[N], and similar detailed description is therefore omitted.

Selection transistor N7 includes a gate coupled to input terminal 1010 configured to carry a signal (not labeled) that includes word line voltage VWL. RRAM device 1000 is thereby configured to provide a current path or interrupt the current path between terminals 1008 and 1006 that includes variable resistance structure RE1 responsive to word line voltage VWL.

In the embodiment depicted in FIG. 10A, selection transistor N7 is an NMOS transistor. In some embodiments, selection transistor N7 is a PMOS transistor configured to provide the current path between terminals 1008 and 1006 in response to word line voltage VWL having an opposite polarity than for the NMOS transistor. In some embodiments, RRAM device 1000 does not include selection transistor N7 and is externally controlled so as to selectively provide the current path responsive to word line voltage VWL.

As depicted in FIG. 10A, current Id flowing through RRAM device 1000 generates a drain-source voltage difference VN1 across selection transistor N7 and between node 1000N and terminal 1008, and generates a voltage difference VRE1 across variable resistance structure RE1 and between terminal 1006 and node 1000N. Voltage difference VN1 corresponds to the selection transistor N7 drain-source voltage. Voltage difference VRE1 has a voltage level equal to that of the voltage of node 1006 (e.g., voltage VBL) minus voltage VN1.

FIG. 10B is a diagram of variable resistance structure RE1, in accordance with some embodiments. Variable resistance structure RE1 is a microelectronic structure that includes a resistive layer L1 having a thickness LT. In addition to resistive layer L1, variable resistance structure RE1 includes one or more features, e.g., conductive elements, that are not depicted in FIG. 10B for the purpose of clarity. In a programming operation, voltage difference VRE1 across resistive layer L1 induces formation of a filament F1, thereby providing a current path for current Id.

Resistive layer L1 is one or more layers of dielectric materials configured to receive voltage difference VRE1 across thickness LT. In various embodiments, resistive layer L1 includes one or more of an oxide of tungsten (W), tantalum (Ta), titanium (Ti), nickel (Ni), cobalt (Co), hafnium (Hf), ruthenium (Ru), zirconium (Zr), zinc (Zn), iron (Fe), tin (Sn), aluminum (Al), copper (Cu), silver (Ag), molybdenum (Mo), chromium (Cr), or another suitable element, a composite material including, e.g., silicon, or another material capable of having either the HRS or LRS.

Based on the presence or absence of filament F1, resistive layer L1 has either the low resistance state (LRS) or a high resistance state (HRS), respectively. The HRS or LRS is indicative of a logical state for storing data. In the embodiment depicted in FIG. 10B, resistive layer L1 includes a single filament F1, and thereby a single current path through which current Id flows, in operation. In some embodiments, resistive layer L1 includes one or more filaments (not shown) in addition to filament F1, and thereby a plurality of current paths through which current Id flows, in operation.

In some embodiments, resistive layer L1 has a resistance value ranging from 1 kilo-ohm (kΩ) to 10 kΩ in the LRS and/or a resistance value ranging from 15 kΩ to 50 kΩ in the HRS.

RRAM device 1000 is thereby configured to, in operation, generate current Id in response to word line voltage VWL based on voltage difference VRE1 and the resistance value of resistive layer L1.

By being included in memory circuit 100-900B discussed above with respect to FIGS. 1-9B, RRAM device 1000 operates to achieve the benefits discussed above with respect to memory circuit 100-900B.

FIG. 11 is a diagram of a tracking device 1100, in accordance with some embodiments. Tracking device 1100 is usable as part or all of one or more tracking cells of tracking cell array 204 or 802, discussed above with respect to FIG. 2 or 8A-8B.

Tracking device 1100 includes input terminal 1110 configured to receive word line voltage VWL' and terminals 1108 and 1106 configured to have respective voltages V1' and V2' and to conduct current Idt, discussed above with respect to FIG. 2. Tracking device 1100 includes a selection transistor N8 coupled between terminal 1108 and node 1100N or terminal 1106.

In some embodiments, terminal 1106 corresponds to at least node 206[0], 206[1], . . . , 206[N] and terminal 1108 corresponds to at least node 208[0], 208[1], . . . , 208[N], and similar detailed description is therefore omitted. In some embodiments, terminal 1110 corresponds to a node (not labelled) where each tracking cell 204[0], 204[1], . . . , 204[N] is coupled to corresponding word line WLD[0], WLD[1], . . . , WLD[N], and similar detailed description is therefore omitted. In some embodiments, word line voltage VWL' corresponds to at least a word line voltage of corresponding word line WLD[0], WLD[1], . . . , WLD[N], and current Idt corresponds to at least current ID[0], ID[1], . . . , ID[N], and similar detailed description is therefore omitted.

Selection transistor N8 includes a gate coupled to input terminal 1110 configured to carry a signal (not labeled) that includes word line voltage VWL'. Tracking device 1100 is thereby configured to provide a current path or interrupt the current path between terminals 1108 and 1106 responsive to word line voltage VWL'.

In the embodiment depicted in FIG. 11, selection transistor N8 is an NMOS transistor. In some embodiments, selection transistor N8 is a PMOS transistor configured to provide the current path between terminals 1108 and 1106 in response to word line voltage VWL' having an opposite polarity than for the NMOS transistor.

As depicted in FIG. 11, current Idt flowing through tracking device 1100 generates a drain-source voltage difference VN2 across selection transistor N8 and between node 1100N and terminal 1108. Voltage difference VN2 corresponds to the selection transistor N8 drain-source voltage.

Tracking device 1100 is thereby configured to, in operation, generate current Idt in response to word line voltage VWL'. By being included in memory circuit 100-900B discussed above with respect to FIGS. 1-9B, Tracking device 1100 operates to achieve the benefits discussed above with respect to memory circuit 100-900B.

Method

Figure 12:
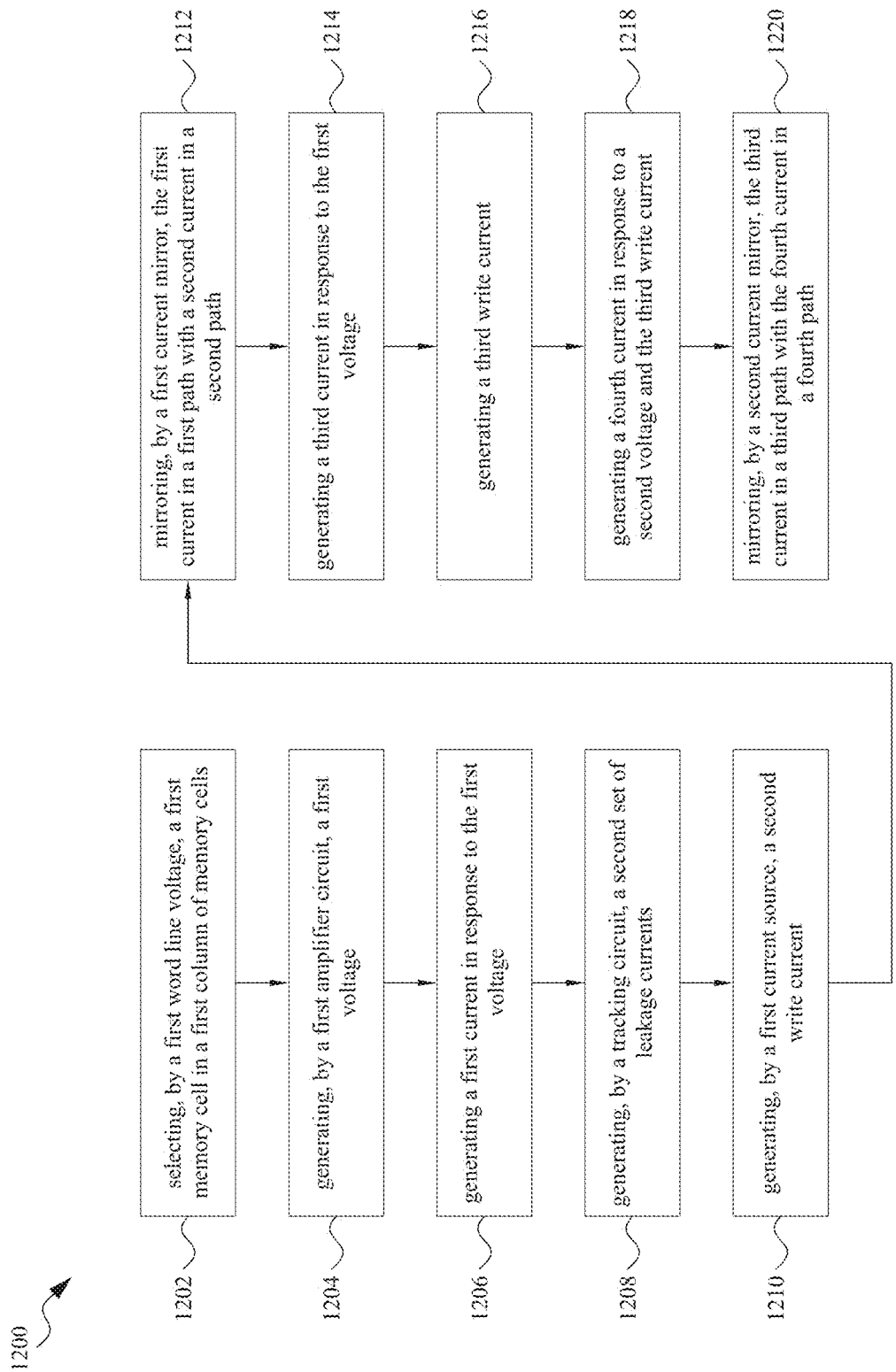
FIG. 12 is a flowchart of a method of operating a circuit, in accordance with some embodiments.

FIG. 12 is a flowchart of a method of operating a circuit, in accordance with some embodiments.

In some embodiments, FIG. 12 is a flowchart of a method of operating the circuit of FIG. 1-2, 3A-3B, 4A-4B, 5, 6A, 7, 8A-8B, 9A-9B, 10A-10B or 11. It is understood that additional operations may be performed before, during, and/or after the method 1200 depicted in FIG. 12, and that some other processes may only be briefly described herein. It is understood that method 1200 utilizes features of one or more of circuits 100, 200, 300A-300B, 400A-400B, 500, 600A, 700, 800A-800B, 900A-900B, 1000A-1000B or 1100 of corresponding FIG. 1-2, 3A-3B, 4A-4B, 5, 6A, 7, 8A-8B, 9A-9B, 10A-10B or 11.

In operation 1202 of method 1200, a first memory cell in a first column of memory cells is selected by a first word line voltage. In some embodiments, the first memory cell in the first column of memory cells is coupled to a first driver circuit. In some embodiments, the first memory cell in the first column of memory cells of method 1200 includes at least memory cell 104[0], 104[1], . . . , 104[N] of memory cell array 104. In some embodiments, the first word line voltage of method 1200 includes at least a voltage of word line WL[0], WL[1], . . . , WL[N]. In some embodiments, the first driver circuit of method 1200 includes at least driver circuit 102 or 302.

In operation 1204 of method 1200, a first voltage is generated by a first amplifier circuit of the first driver circuit. In some embodiments, the first voltage of method 1200 includes at least voltage VBL. In some embodiments, the first amplifier circuit of method 1200 is amplifier OP2.

In operation 1206 of method 1200, a first current is generated in response to the first voltage. In some embodiments, the first current includes a first set of leakage currents and a first write current.

In some embodiments, the first current of method 1200 includes at least current IS. In some embodiments, the first leakage current of method 1200 includes at least leakage current ILeak. In some embodiments, the first leakage current of method 1200 includes at least leakage current I0[0], I0[1], . . . , I0[N]. In some embodiments, the first write current of method 1200 includes at least current Icell.

In some embodiments, operation 1206 includes turning on a first transistor in response to the first voltage thereby generating the first current. In some embodiments, the first transistor is coupled to a first voltage supply (VDD). In some embodiments, the first transistor of method 1200 includes at least transistor P1 or P6. In some embodiments, the first transistor of method 1200 includes at least transistor P7 or N4.

In operation 1208 of method 1200, a second set of leakage currents is generated by a tracking circuit. In some embodiments, the second set of leakage currents is configured to track the first set of leakage currents of the first column of memory cells.

In some embodiments, the second set of leakage currents of method 1200 includes at least leakage current IComp. In some embodiments, the first leakage current of method 1200 includes at least leakage current ID[0], ID[1], . . . , ID[N]. In some embodiments, the tracking circuit of method 1200 includes at least tracking circuit 120 or 220, tracking cell array 204 or 802 or driver circuit 306.

In some embodiments, operation 1208 includes selecting a first tracking cell in a first column of tracking cells (104) by a second word line voltage. In some embodiments, the first tracking cell in the first column of tracking cells is coupled to a second driver circuit.

In some embodiments, the first tracking cell in the first column of tracking cells of method 1200 includes at least tracking cell 204[0], 204[1], . . . , 204[N] of tracking cell array 204. In some embodiments, the first tracking cell in the first column of tracking cells of method 1200 includes at least tracking cell 804[0], 804[1], . . . , 804[N] of tracking cell array 804. In some embodiments, the second word line voltage of method 1200 includes at least a voltage of word line WLD[0], WLD [1], . . . , WLD[N]. In some embodiments, the second driver circuit of method 1200 includes at least driver circuit 306.

In some embodiments, operation 1208 further includes generating a second voltage by the second driver circuit. In some embodiments, the second voltage of method 1200 includes at least voltage VREF.

In some embodiments, operation 1208 further includes turning on a second transistor in response to the second voltage thereby generating the second set of leakage currents. In some embodiments, the second transistor is coupled to the first voltage supply. In some embodiments, the second transistor of method 1200 includes at least transistor P2, P3, P8, P9, P10 or P11. In some embodiments, the second transistor of method 1200 includes at least transistor P4 or N3.

In operation 1210 of method 1200, a second write current is generated by a first current source. In some embodiments, the second write current of method 1200 includes at least current IT. In some embodiments, the first current source of method 1200 includes at least current source 110 or 510.

In operation 1212 of method 1200, the first current in a first path is mirrored with a second current in a second path. In some embodiments, operation 1210 is performed by a first current mirror. In some embodiments, the first path of method 1200 includes at least path 150, 152 or 452. In some embodiments, the second path of method 1200 includes at least path 158 or 558.

In some embodiments, the first current mirror of method 1200 includes at least footer circuit 130 or 530. In some embodiments, the first current mirror of method 1200 includes at least header circuit 430.

In some embodiments, the second current of method 1200 includes at least current ID. In some embodiments, the second current includes the second set of leakage currents and the second write current. In some embodiments, the first write current corresponds to the second write current. In some embodiments, the first set of leakage currents corresponds to the second set of leakage currents.

In operation 1214 of method 1200, generating a third current in response to the first voltage. In some embodiments, the third current of method 1200 includes at least current IS.

In some embodiments, operation 1214 includes turning on a third transistor in response to the first voltage thereby generating the third current. In some embodiments, the third transistor is coupled to the first voltage supply. In some embodiments, the third transistor of method 1200 includes at least transistor P1 or P6. In some embodiments, the third transistor of method 1200 includes at least transistor P7 or N4.

In operation 1216 of method 1200, a third write current is generated by a second current source. In some embodiments, the third write current of method 1200 includes at least current IT. In some embodiments, the second current source of method 1200 includes at least current source 110 or 510.

In operation 1218 of method 1200, a fourth current is generated in response to the second voltage and the third write current. In some embodiments, the fourth current of method 1200 includes at least current ID. In some embodiments, the fourth current includes the second set of leakage currents and the second write current.

In some embodiments, operation 1218 includes turning on a fourth transistor in response to the second voltage thereby generating the second set of leakage currents. In some embodiments, the fourth transistor is coupled to the first voltage supply. In some embodiments, the fourth transistor of method 1200 includes at least transistor P2, P3, P8, P9, P10 or P11. In some embodiments, the fourth transistor of method 1200 includes at least transistor P4 or N3.

In operation 1220 of method 1200, the third current in a third path is mirrored with the fourth current in a fourth path. In some embodiments, operation 1220 is performed by a second current mirror.

In some embodiments, the third path of method 1200 includes at least path 150, 152 or 452. In some embodiments, the fourth path of method 1200 includes at least path 158 or 558.

In some embodiments, the second current mirror of method 1200 includes at least footer circuit 130 or 530. In some embodiments, the second current mirror of method 1200 includes at least header circuit 430.

In some embodiments, the third current includes the first set of leakage currents and the first write current. In some embodiments, the fourth current includes the second set of leakage currents and the third write current. In some embodiments, the first write current corresponds to the third write current. In some embodiments, the third current corresponds to the fourth current.

In some embodiments, one or more of the operations of method 1200 is not performed. Furthermore, various PMOS or NMOS transistors shown in FIGS. 2-9B are of a particular dopant type (e.g., N-type or P-type) are for illustration purposes. Embodiments of the disclosure are not limited to a particular transistor type, and one or more of the PMOS or NMOS transistors shown in FIGS. 2-9B can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transmission gates in FIGS. 9A-9B is within the scope of various embodiments. Selecting different numbers of transistors in FIG. 2-9B is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a method of operating a memory circuit. The method includes selecting, by a first word line voltage, a first memory cell in a first column of memory cells coupled to a first driver circuit. In some embodiments, the method further includes generating, by a first amplifier circuit of the first driver circuit, a first voltage. In some embodiments, the method further includes generating a first current in response to the first voltage, the first current including a first set of leakage currents and a first write current. In some embodiments, the method further includes generating, by a tracking circuit, a second set of leakage currents, the second set of leakage currents configured to track the first set of leakage currents of the first column of memory cells. In some embodiments, the method further includes generating, by a first current source, a second write current. In some embodiments, the method further includes mirroring, by a first current mirror, the first current in a first path with a second current in a second path, the second current including the second set of leakage currents and the second write current, the first write current corresponding to the second write current, and the first set of leakage currents corresponding to the second set of leakage currents.

Another aspect of this description relates to a method of operating a memory circuit. The method includes generating, by a first amplifier circuit of a first driver circuit, a first voltage, and the first driver circuit being coupled to a first memory cell in a first column of memory cells. In some embodiments, the method further includes generating a first current in response to the first voltage, the first current including a first set of leakage currents and a first write current. In some embodiments, the method further includes generating, by a tracking circuit, a second set of leakage currents, the second set of leakage currents configured to track the first set of leakage currents of the first column of memory cells. In some embodiments, the method further includes mirroring, by a first current mirror, the first current in a first path with a second current in a second path, the second current including the second set of leakage currents and a second write current, the first write current corresponding to the second write current, and the first set of leakage currents corresponding to the second set of leakage currents.

Still another aspect of this description relates to a method of operating a memory circuit. The method includes selecting, by a first word line voltage, a first memory cell in a first column of memory cells coupled to a first driver circuit. In some embodiments, the method further includes generating, by a first amplifier circuit of the first driver circuit, a first voltage. In some embodiments, the method further includes generating a first current in response to the first voltage, the first current including a first set of leakage currents and a first write current, the first set of leakage currents corresponding to a leakage current of each corresponding cell in the first column of memory cells. In some embodiments, the method further includes selecting, by a second word line voltage, a first tracking cell in a first column of tracking cells of a tracking circuit. In some embodiments, the method further includes generating a second set of leakage currents by the tracking circuit, the second set of leakage currents configured to track the first set of leakage currents of the first column of memory cells. In some embodiments, the method further includes mirroring, by a first current mirror, the first current in a first path with a second current in a second path, the second current including the second set of leakage currents and a second write current, the first write current corresponding to the second write current, and the first set of leakage currents corresponding to the second set of leakage currents.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory circuit, the method comprising:
   selecting, by a first word line voltage, a first memory cell in a first column of memory cells coupled to a first driver circuit;
   generating, by a first amplifier circuit of the first driver circuit, a first voltage;
   generating a first current in response to the first voltage, the first current including a first set of leakage currents and a first write current;
   generating, by a tracking circuit, a second set of leakage currents, the second set of leakage currents configured to track the first set of leakage currents of the first column of memory cells;
   generating, by a first current source, a second write current; and
   mirroring, by a first current mirror, the first current in a first path with a second current in a second path, the second current including the second set of leakage currents and the second write current, the first write current corresponding to the second write current, and the first set of leakage currents corresponding to the second set of leakage currents.

2. The method of claim 1, wherein generating the first current in response to the first voltage comprises:

turning on a first transistor in response to the first voltage thereby generating the first current, the first transistor being coupled to a first voltage supply.

3. The method of claim 2, wherein generating the first current in response to the first voltage further comprises:
turning on a second transistor in response to a first signal thereby generating the first current, the second transistor being coupled between the first transistor and the first column of memory cells.

4. The method of claim 3, wherein generating the first current in response to the first voltage further comprises:
turning on a third transistor in response to a second signal thereby generating the first current, the third transistor being coupled between the first column of memory cells and a reference voltage supply.

5. The method of claim 1, wherein generating, by the tracking circuit, the second set of leakage currents comprises:
selecting, by a second word line voltage, a first tracking cell in a first column of tracking cells coupled to a second driver circuit;
generating, by the second driver circuit, a second voltage; and
turning on a first transistor in response to the second voltage thereby generating the second set of leakage currents, the first transistor being coupled to a first voltage supply.

6. The method of claim 5, wherein generating, by the tracking circuit, the second set of leakage currents further comprises:
turning on a second transistor in response to a first signal thereby generating the second set of leakage currents, the second transistor being coupled between the first transistor and the first column of tracking cells.

7. The method of claim 6, wherein generating, by the tracking circuit, the second set of leakage currents further comprises:
turning on a third transistor in response to a second signal thereby generating the second set of leakage currents, the third transistor being coupled between the first column of tracking cells and a reference voltage supply.

8. The method of claim 5, further comprising:
generating a third current in response to the first voltage.

9. The method of claim 8, wherein generating the third current in response to the first voltage comprises:
turning on a second transistor in response to the first voltage thereby generating the third current, the second transistor being coupled to the first voltage supply.

10. The method of claim 9, further comprising:
generating, by a second current source, a third write current;
generating a fourth current in response to the second voltage and the third write current; and
mirroring, by a second current mirror, the third current in a third path with the fourth current in a fourth path, the third current including the first set of leakage currents and the first write current, and the fourth current including the second set of leakage currents and the third write current.

11. The method of claim 10, wherein generating the fourth current in response to the second voltage and the third write current comprises:
turning on a third transistor in response to the second voltage thereby generating the second set of leakage currents, the third transistor being coupled to the first voltage supply.

12. A method of operating a memory circuit, the method comprising:
generating, by a first amplifier circuit of a first driver circuit, a first voltage, the first driver circuit being coupled to a first memory cell in a first column of memory cells;
generating a first current in response to the first voltage, the first current including a first set of leakage currents and a first write current;
generating, by a tracking circuit, a second set of leakage currents, the second set of leakage currents configured to track the first set of leakage currents of the first column of memory cells; and
mirroring, by a first current mirror, the first current in a first path with a second current in a second path, the second current including the second set of leakage currents and a second write current, the first write current corresponding to the second write current, and the first set of leakage currents corresponding to the second set of leakage currents.

13. The method of claim 12, wherein generating the second set of leakage currents comprises:
turning on a first transistor in response to a second voltage thereby generating the second set of leakage currents, the first transistor being coupled between a first voltage supply and the first current mirror.

14. The method of claim 12, further comprising:
generating, by a first current source, the second write current.

15. The method of claim 13, further comprising:
generating a third current in response to the first voltage.

16. The method of claim 15, wherein generating the third current in response to the first voltage comprises:
turning on a second transistor in response to the first voltage thereby generating the third current, the second transistor being part of a header circuit, and being coupled to the first voltage supply and a footer circuit.

17. The method of claim 15, further comprising:
generating, by a current source, a third write current;
generating a fourth current in response to the second voltage and the third write current; and
mirroring, by a second current mirror, the third current in a third path with the fourth current in a fourth path, the third current including the first set of leakage currents and the first write current, and the fourth current including the second set of leakage currents and the third write current, the second current mirror being part of a footer circuit.

18. The method of claim 17, wherein generating the fourth current in response to the second voltage and the third write current comprises:
turning on a second transistor in response to the second voltage thereby generating a fifth current, the fifth current being the second set of leakage currents, and the second transistor being coupled to the first voltage supply, a second driver circuit and the second current mirror.

19. A method of operating a memory circuit, the method comprising:
selecting, by a first word line voltage, a first memory cell in a first column of memory cells coupled to a first driver circuit;
generating, by a first amplifier circuit of the first driver circuit, a first voltage;
generating a first current in response to the first voltage, the first current including a first set of leakage currents and a first write current, the first set of leakage currents corresponding to a leakage current of each corresponding cell in the first column of memory cells;
selecting, by a second word line voltage, a first tracking cell in a first column of tracking cells of a tracking circuit;
generating a second set of leakage currents by the tracking circuit, the second set of leakage currents configured to track the first set of leakage currents of the first column of memory cells; and
mirroring, by a first current mirror, the first current in a first path with a second current in a second path, the second current including the second set of leakage currents and a second write current, the first write current corresponding to the second write current, and the first set of leakage currents corresponding to the second set of leakage currents.

20. The method of claim 19, further comprising:
generating, by a first current source, the second write current.

\* \* \* \* \*